United States Patent
Naaman

(10) Patent No.: US 12,355,437 B2
(45) Date of Patent: Jul. 8, 2025

(54) JOSEPHSON PARAMETRIC DEVICES HAVING SAME-FREQUENCY PORTS

(71) Applicant: Google LLC, Mountain View, CA (US)

(72) Inventor: Ofer Naaman, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 18/556,039

(22) PCT Filed: Apr. 12, 2022

(86) PCT No.: PCT/US2022/024424
§ 371 (c)(1),
(2) Date: Oct. 18, 2023

(87) PCT Pub. No.: WO2022/225751
PCT Pub. Date: Oct. 27, 2022

(65) Prior Publication Data
US 2024/0204779 A1    Jun. 20, 2024

Related U.S. Application Data

(60) Provisional application No. 63/177,174, filed on Apr. 20, 2021.

(51) Int. Cl.
*H03K 17/92* (2006.01)
(52) U.S. Cl.
CPC ..................... *H03K 17/92* (2013.01)
(58) Field of Classification Search
CPC ....................................... H03K 17/92
USPC .......................................... 327/528
See application file for complete search history.

(56) References Cited

U.S. PATENT DOCUMENTS

| | | |
|---|---|---|
| 9,923,538 B2 | 3/2018 | Abdo |
| 10,171,077 B2 | 1/2019 | Abdo et al. |
| 10,461,385 B2 | 10/2019 | Sliwa et al. |
| 11,599,819 B2 | 3/2023 | Abdo |

(Continued)

OTHER PUBLICATIONS

Nagulu, A., et al., "Non-Magnetic Non-Reciprocal Microwave Components—State of the Art and Future Decisions", Jan. 7, 2021, IEEE Journal of Microwaves. (Year: 2021).*

(Continued)

*Primary Examiner* — Tomi Skibinski
(74) *Attorney, Agent, or Firm* — DORITY & MANNING, P.A.

(57) ABSTRACT

A Josephson parametric device (e.g., a circulator/isolator or directional amplifier) can include a plurality of resonant modes, a plurality of couplings, an input port and an output port. The plurality of resonant modes includes first, second, and third resonant modes, the first and third resonant modes both configured to operate at a first resonant frequency and the second resonant mode configured to operate at a second resonant frequency that is different than the first resonant frequency. The plurality of couplings includes a passive coupling between the first and third resonant modes, a first parametric coupling between the first and second resonant modes, and a second parametric coupling between the second and third resonant modes. The input port is coupled to the first resonant mode of the device, and the output port is coupled to the third resonant mode of the device.

20 Claims, 8 Drawing Sheets

(56) References Cited

U.S. PATENT DOCUMENTS 11,728,772 B2 8/2023 Abdo
2020/0350880 A1 11/2020 Miano et al.

OTHER PUBLICATIONS

International Preliminary Report on Patentability for Application No. PCT/US2022/024424, mailed Nov. 2, 2023, 9 pages.
Anderson, "An Analysis of Broadband Circulators with External Tuning Elements", IEEE Transactions on Microwave Theory and Techniques, vol. 15, No. 1, Jan. 1, 1967, XP011385107, 6 pages.
Lecocq et al., "Nonreciprocal Microwave Signal Processing with a Field-Programmable Josephson Amplifier", arxiv.org, Dec. 5, 2016, XP080136896, 18 pages.
Nagulu et al., "Non-Magnetic Non-Reciprocal Microwave Components—State of the Art and Future Directions", IEEE Journal of Microwaves, vol. 1, No. 1, Jan. 11, 2021, XP011831480.
International Search Report for Application No. PCT/US2022/024424, mailed on Aug. 10, 2022, 2 pages.

\* cited by examiner

JOSEPHSON PARAMETRIC DEVICES
HAVING SAME-FREQUENCY PORTS

PRIORITY CLAIM

This application is based upon and claims the right of priority under 35 U.S.C. § 371 to International Application No. PCT/US2022/024424 filed on Apr. 12, 2022 which claims the benefit of priority to U.S. Provisional Patent Application No. 63/177,174 filed on Apr. 20, 2021. Applicant claims priority to and the benefit of each of such applications and incorporates all such applications herein by reference in its entirety.

FIELD

The present disclosure relates generally to systems, devices, and computer-implemented methods that include Josephson parametric devices having same frequency ports.

BACKGROUND

Various parametric devices, from amplifiers to circulators, have been built with Josephson junctions. Parametric amplifiers have become used in a first gain stage of qubit readout for quantum computing applications. Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b|1\rangle$ The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a parametric device. The parametric device can include a plurality of resonant modes (e.g., a first resonant mode, a second resonant mode, and a third resonant mode), a passive coupling, an input port, and an output port. The first resonant mode and the third resonant mode are both configured to operate at a first resonant frequency, while the second resonant mode is configured to operate at a second resonant frequency that is different than the first resonant frequency. The passive coupling is positioned between the first resonant mode and the third resonant mode. The input port is coupled to the first resonant mode of the parametric device, and the output port is coupled to the third resonant mode of the parametric device.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
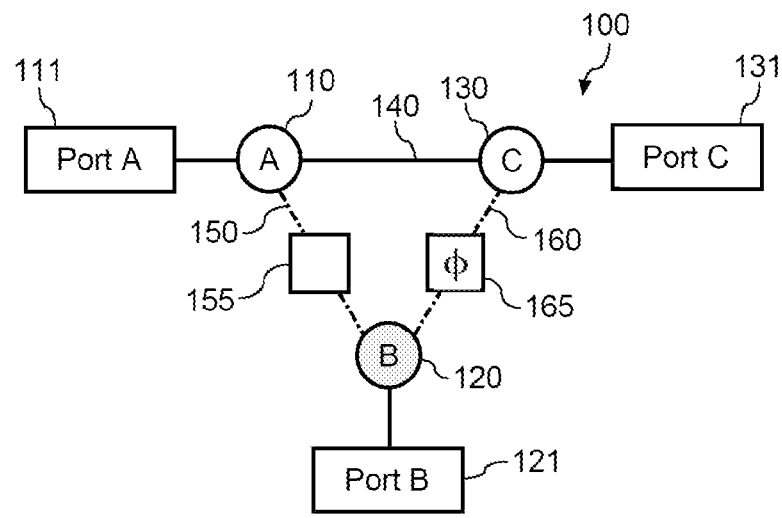
FIG. 1 depicts an example block diagram of a first exemplary parametric device according to example aspects of the present disclosure.

Example aspects of the present disclosure are directed to systems, devices, and computer-implemented methods for implementing Josephson parametric devices having same-frequency ports. Josephson parametric devices can include, but are not limited to circulators, isolators, and/or directional amplifiers. Such devices can be configured to operate at a plurality of different resonant modes, while configuring a resonant mode associated with a device input port and another resonant mode associated with a device output port to be substantially the same. In the context of qubit readout, circuitry that includes one or more Josephson parametric devices can provide improved readout response as well as a beneficial reduction in the required cryogenic space of readout system hardware for a quantum computer.

More particularly, example aspects of the disclosed technology are directed to improved Josephson parametric devices. In some example embodiments, a parametric device can include at least one Josephson junction device configured to serve as a modulated reactance. In some examples, the Josephson junction device is configured to operate as a Superconducting QUantum Interference Device (SQUID). The Josephson junction device can provide parametric coupling among selected resonant modes of a parametric device, for example, first, second, and third resonant modes. The various resonant modes can be embodied by resonator structures (e.g., first, second, and third resonator structures), such as but not limited to lumped-element LC resonators, transmission line resonators, or any other resonant circuit (e.g., electrical, opto-mechanical, or the like).

In accordance with another example aspect of the present disclosure, a Josephson parametric device including first, second, and third resonant modes can be configured to have same-frequency ports. This can be accomplished, at least in part, by configuring two of the three resonant modes to operate at a same first frequency. These same-frequency modes and corresponding ports can form the input and output modes/ports for the parametric device. For example, the first and third resonant modes of the parametric device can both be configured to operate at a first resonant frequency, while the second resonant mode can be configured to operate at a second resonant frequency that is different than the first resonant frequency. An input port can be coupled to the first resonant mode of the device, while an output port can be coupled to the third resonant mode of the device. In some example embodiments, the second resonant mode is also configured to serve as an external port, in which case the parametric device can be configured to operate as a circulator. In other example embodiments, the second resonant mode is terminated internally (e.g., by being coupled to an impedance that provides an internal termination for the second resonant mode), in which case the parametric device can be configured to operate as an isolator. In still further example embodiments, the parametric device can be configured to operate as a directional amplifier.

In some example embodiments, a combination of passive and parametric couplings are included to couple the various resonant modes to one another in a parametric device. For example, a coupling between the input and output ports, corresponding to a coupling between the first and third resonant modes, can be a passive coupling. In some embodiments, the passive coupling between first and third resonant modes can be a capacitive coupling. In some embodiments, the passive coupling between first and third resonant modes can be an inductive coupling. By providing a device configuration that accommodates at least one passive coupling to replace what would otherwise be a parametric coupling, circuitry simplification and size reduction can be advantageously realized. In addition, an output signal provided at the output port remains coherent with an input signal provided at the input port, without requiring coherence of the pump and signal generators employed at the parametric couplings.

Still further, a parametric device can include a first parametric coupling between the first resonant mode and the second resonant mode and a second parametric coupling between the second resonant mode and the third resonant mode. In some embodiments, the first and second parametric couplings include respective Josephson junction devices (e.g., SQUID couplers) that are pumped parametrically at respective parametric pump frequencies. When a parametric device is configured to operate as a circulator/isolator, the first parametric coupling and the second parametric coupling are configured to receive a pump tone signal characterized by a pump frequency that is defined as a difference between the first resonant frequency and the second resonant frequency. When a parametric device is configured to operate as a directional amplifier, the first parametric coupling and the second parametric coupling are configured to receive a pump tone signal characterized by a pump frequency that is defined as a sum of the first resonant frequency and the second resonant frequency. In both an isolator/circulator configuration and a directional amplifier configuration, a phase of the pump tone signal provided to the first parametric coupling can be shifted (e.g., shifted by a phase offset of about 90 degrees) relative to a phase of the pump tone signal provided to the second parametric coupling.

In accordance with another example aspect of the present disclosure, a reduction in the number of pump tone sources and corresponding signal generators can be realized by nature of the parametric device design having same-frequency ports. For example, the parametric device can include a signal generator configured to serve as a single source for generating the pump tone signal provided to both the first parametric coupling and the second parametric coupling in a parametric device. The single signal generator can be realized because the two pump tones (e.g., a first pump tone signal provided to the first parametric coupling and a second pump tone signal provided to the second parametric coupling) are at the same frequency.

In accordance with another example aspect of the present disclosure, additional resonant modes and matching circuitry can be incorporated within a parametric device to get better broad-band response in both transmission and isolation of device signals. More particularly, in some examples, matching circuitry can include one or more additional first resonant modes coupled between the first resonant mode and the input port, one or more additional second resonant modes coupled to the second resonant mode, and one or more additional third resonant modes coupled between the third resonant mode and the output port. More particularly, in some embodiments, a parametric device can include three first resonant modes, three second resonant modes, and three third resonant modes, each iteration within a given resonant mode configured to operate at substantially the same resonant frequency.

Still further, the matching circuitry can provide impedance matching over a specified frequency band to the various device ports. In some example embodiments, the matching circuitry can also include additional passive couplings between the first resonant mode and the one or more additional first resonant modes, between the one or more additional first resonant modes and the input port, between the second resonant mode and the one or more additional second resonant modes, between the one or more additional second resonant modes and an internal termination or second port, between the third resonant mode and the one or more additional third resonant modes, and between the one or more additional third resonant modes and the output port. Such additional passive couplings can include capacitive couplings and/or inductive couplings, without requiring additional parametric couplings.

In some specific implementations, band-pass network synthesis techniques can be employed to specifically engineer device bandwidth in a manner that advantageously benefits overall device performance. For example, in quantum computing readout applications, matching circuitry is designed to achieve parametric device bandwidth that is greater than about 10 MHZ. In some examples, matching circuitry is designed to achieve parametric device bandwidth that is greater than about 20 MHZ. In some examples, matching circuitry is designed to achieve parametric device bandwidth that is up to about 500 MHZ (½ GHZ). In some examples, matching circuitry is designed to achieve parametric device bandwidth that is in a range of between about 20 MHz and about 500 MHZ. This achieves significant benefits compared with known parametric device configurations that provide circuit gain and isolation in a relatively narrow band of about 10 MHz or less.

In accordance with another example aspect of the present disclosure, one or more of the disclosed parametric devices can be incorporated into a readout system for a quantum computing device. For example, a readout system can include a plurality of resonators, a filter, and at least a first Josephson parametric device. The plurality of resonators can be configured for coupling to a plurality of qubits. Qubits can be formed in accordance with one or more of the same or different qubit technologies for quantum computing. For example, qubits can be or can include superconducting qubits (e.g., transmon qubits), semiconductor quantum dots, trapped ion qubits, photonic qubits, defect-based qubits, topological nanowire qubits, or nuclear magnetic resonance qubits. A filter (e.g., a Purcell filter or other bandpass filter) can be coupled to the plurality of resonators and configured to produce a bandpass response for readout signals received by the plurality of resonators.

When a readout system according to the disclosed technology includes a first Josephson parametric device, such device can be configured to receive an output from the filter as an input signal and to generate a first output signal. The first Josephson parametric device can also more particularly include first, second, and third resonant modes, the first resonant mode and the third resonant mode both configured to operate at a first resonant frequency and the second resonant mode configured to operate at a second resonant frequency that is different than the first resonant frequency. The Josephson parametric device can include a plurality of couplings including a passive coupling between the first resonant mode and the third resonant mode, a first parametric coupling between the first resonant mode and the second resonant mode, and a second parametric coupling between the second resonant mode and the third resonant mode.

In some example embodiments of the disclosed technology, a readout system can additionally or alternatively include a second Josephson parametric device. More particularly, a second Josephson parametric device can be configured to receive the first output signal from the first Josephson parametric device as an input signal and to generate a second output signal. The second Josephson parametric device can include fourth, fifth, and sixth resonant modes, the fourth resonant mode and the sixth resonant modes both configured to operate at a third resonant frequency and the fifth resonant mode configured to operate at a fourth resonant frequency that is different than the third resonant frequency. The second Josephson parametric device can also include a plurality of couplings including a passive coupling between the fourth resonant mode and the sixth resonant mode, a first parametric coupling between the fourth resonant mode and the fifth resonant mode, and a second parametric coupling between the fifth resonant mode and the sixth resonant mode.

When multiple Josephson parametric devices are incorporated into a readout system or other quantum computing application, one or more of the devices can be configured for operation as a circulator or isolator while another one or more of the devices can be configured for operation as a directional amplifier. For example, in one particular embodiment, a first Josephson parametric device can be configured to operate as a circulator and a second Josephson parametric device can be configured to operate as a directional amplifier. In such instance, the first parametric coupling between the first resonant mode and the second resonant mode and the second parametric coupling between the second resonant mode and the third resonant mode can be configured to receive a pump tone signal characterized by a pump frequency that is defined as a difference between the first resonant frequency and the second resonant frequency. The first parametric coupling between the fourth resonant mode and the fifth resonant mode and the second parametric coupling between the fifth resonant mode and the sixth resonant mode can be configured to receive a pump tone signal characterized by a pump frequency that is defined as a sum of the third resonant frequency and the fourth resonant frequency. Because the first Josephson parametric device is configured to operate as a circulator/isolator, the received input signal of the first Josephson parametric device is transmitted as the first output signal in a forward direction while backwards transmission is prevented. Because the second Josephson parametric device is configured to operate as an amplifier, an amplified version of the first output signal is generated by the second Josephson parametric device and provided as the second output signal.

Readout systems incorporating one or more of the disclosed parametric devices can also include additional readout devices provided in one or more temperature stages of the readout process. For example, the Josephson parametric devices can be provided for readout at lower temperature stages, while additional readout devices can be provided for readout or subsequent signal processing at higher temperature stages. In some examples, low-noise amplifier (LNA) and/or receiver components can be provided at one or more higher temperatures. For example, a readout system can include one or more Josephson parametric devices that are configured for operation in a first temperature range (e.g., a cryogenic temperature range inclusive of less than about 1 kelvin (K) or less than about 100 millikelvin (mK)). A readout system can further include one or more readout devices (e.g., an LNA device) that are coupled to and configured to receive an output from the one or more Josephson parametric devices, and that are configured for operation in a second temperature range. In some examples, the second temperature range can be higher than the first temperature range, for example but not limited to a range inclusive of about 4 K, or between about 1 K and about 10 K. A readout system can further include one or more readout devices (e.g., a receiver) that are coupled to and configured to receive an output from the LNA device, and that are configured for operation in a third temperature range. In some examples, the third temperature range can be higher than the second temperature range, for example but not limited to a range that is at or near room temperature (e.g., a range inclusive of about 300 K, or between about 250 K and about 350 K).

Yet another example aspect of the disclosed technology generally concerns quantum computing systems and related apparatus that incorporate one or more of the disclosed Josephson parametric devices. For example, a quantum computing system can include quantum hardware and a readout system. The quantum hardware can include a plurality of qubits. The readout system can be coupled to the plurality of qubits for receiving a readout response of the plurality of qubits. The readout system can include one or more Josephson parametric devices. Each Josephson parametric device can include at least first, second, and third resonant modes, the first resonant mode and the third resonant mode both configured to operate at a first resonant frequency and the second resonant mode configured to operate at a second resonant frequency that is different than the first resonant frequency. Each Josephson parametric device can also include a plurality of couplings including a passive coupling between the first resonant mode and the third resonant mode, a first parametric coupling between the first resonant mode and the second resonant mode, and a second parametric coupling between the second resonant mode and the third resonant mode. In some examples, the one or more Josephson parametric devices includes a first Josephson parametric device configured to operate as a circulator or an isolator and a second Josephson parametric device configured to operate as a directional amplifier.

Systems and methods according to example aspects of the present disclosure can provide for a number of technical effects and benefits, including but not limited to improvements to computing technology (e.g., quantum computing technology). For instance, example aspects of the present disclosure can provide for improved readout response in quantum computing applications, particularly by providing improved quantum-noise limited qubit readout performance with increased gain over a wide signal bandwidth. This is especially beneficial in real-world (e.g., noisy) quantum computing applications, which present a need for rapid and accurate readout of reflection measurements on an increasing number of qubits.

Additional benefits and advantages of the disclosed technology can be achieved by reducing a size and number of hardware components that are required for implementation within the valuable real estate of a quantum computing system. Because many Josephson parametric amplifiers operate in reflection mode, several circulators can be required to separate incoming and amplified signals. Parametric circulators in accordance with the disclosed technology can be used to reduce or replace any larger conventional ferrite circulators. In addition, parametric devices designed with same-frequency ports reduce the number of different phase-coherent pump tones that are needed for effective device operation. In the context of qubit readout, these benefits reduce the requirements for readout hardware that is implemented in the cryogenic space of the quantum computer. This can be a substantial advantage in a scaled-up quantum computing system having hundreds of readout channels.

Additional benefits and advantages of the disclosed technology can be achieved in the context of qubit readout applications because input and output ports have the same frequency and are coherent with each other irrespective of the pump overall phase. Therefore, in a qubit readout context, the readout receiver can be configured to phase-lock to the readout transmitter without requiring a strict phase relationship between the pump generator and the readout transmitter.

One example aspect of the present disclosure is directed to a parametric device. The parametric device can include a first resonant mode, a second resonant mode, a third resonant mode, a passive coupling, an input port, and an output port. The first resonant mode and the third resonant mode are both configured to operate at a first resonant frequency, while the second resonant mode is configured to operate at a second resonant frequency that is different than the first resonant frequency. The passive coupling is positioned between the first resonant mode and the third resonant mode. The input port is coupled to the first resonant mode of the parametric device, and the output port is coupled to the third resonant mode of the parametric device.

In some implementations, the parametric device can be configured to operate as a circulator or isolator. In such implementations, a first parametric coupling can be provided between the first resonant mode and the second resonant mode, while a second parametric coupling can be provided between the second resonant mode and the third resonant mode. The first parametric coupling and the second parametric coupling are configured to receive a pump tone signal characterized by a pump frequency that is defined as a difference between the first resonant frequency and the second resonant frequency. A phase of the pump tone signal provided to the first parametric coupling is shifted relative to a phase of the pump tone signal provided to the second parametric coupling.

In some implementations, the parametric device can be configured to operate as a directional amplifier. In such implementations, a first parametric coupling can be provided between the first resonant mode and the second resonant mode, while a second parametric coupling can be provided between the second resonant mode and the third resonant mode. The first parametric coupling and the second parametric coupling are configured to receive a pump tone signal characterized by a pump tone frequency that is defined as a sum of the first resonant frequency and the second resonant frequency. A phase of the pump tone signal provided to the first parametric coupling is shifted relative to a phase of the pump tone signal provided to the second parametric coupling.

Another example aspect of the present disclosure is directed to a readout system for a quantum computing device. The readout system can include a plurality of resonators, a filter, and a first Josephson parametric device. The plurality of resonators is configured for coupling to a respective plurality of qubits. The filter is coupled to the plurality of resonators and configured to produce a bandpass response for readout signals received by the plurality of resonators. The first Josephson parametric device is configured to receive an output from the filter as an input signal and to generate a first output signal. The first Josephson parametric device includes first, second, and third resonant modes and a plurality of couplings. The first resonant mode and the third resonant mode are both configured to operate at a first resonant frequency, while the second resonant mode is configured to operate at a second resonant frequency that is different than the first resonant frequency. The plurality of couplings includes a passive coupling between the first resonant mode and the third resonant mode, a first parametric coupling between the first resonant mode and the second resonant mode, and a second parametric coupling between the second resonant mode and the third resonant mode.

Another example aspect of the present disclosure is directed to a quantum computing system. The quantum computing system can include quantum hardware and a readout system. The quantum hardware includes a plurality of qubits. The readout system is coupled to the plurality of qubits for receiving a readout response of the plurality of qubits. The readout system includes one or more Josephson parametric devices. Each Josephson parametric device includes first, second, and third resonant modes and a plurality of couplings. The first resonant mode and the third resonant mode are both configured to operate at a first resonant frequency. The second resonant mode is configured to operate at a second resonant frequency that is different than the first resonant frequency. The plurality of couplings includes a passive coupling between the first resonant mode and the third resonant mode, a first parametric coupling between the first resonant mode and the second resonant mode, and a second parametric coupling between the second resonant mode and the third resonant mode.

With reference now to the FIGS., example embodiments of the present disclosure will be discussed in further detail.

FIG. 1 depicts an example block diagram of a first exemplary parametric device according to example aspects of the present disclosure. More particularly, parametric device 100 corresponds to a Josephson parametric circulator having same-frequency ports. Parametric device 100 can include a plurality of resonant modes, for example, a first (A) resonant mode 110, a second (B) resonant mode 120, and a third (C) resonant mode 130. The various resonant modes 110, 120, and 130 can be embodied by resonator structures (e.g., first, second, and third resonator structures), such as but not limited to lumped-element LC resonators, transmission line resonators, or any other resonant circuit (e.g., electrical, opto-mechanical, or the like).

Each resonant mode of parametric device 100 is coupled to a corresponding port. More particularly, first resonant mode 110 is coupled to a first (A) port 111, second resonant mode 120 is coupled to a second (B) port 121, and third resonant mode 130 is coupled to a third (C) port 131. First port 111 is configured to serve as an input port for parametric device 100, while third port 131 is configured to serve as an output port for parametric device 100. In some implementations, second port 121 provides an additional external port such that parametric device 100 is configured to operate as a circulator. In other implementations, parametric device 100 includes an impedance coupled to and providing an internal termination (e.g., a 50 ohm termination) for the second resonant mode 120 such that parametric device 100 is configured to operate as an isolator.

Referring still to FIG. 1, parametric device 100 can be configured to have same-frequency ports. This can be accomplished, at least in part, by configuring two of the three resonant modes 110, 120, and 130 to operate at a same first frequency. These same-frequency modes and corresponding ports can form the input and output modes/ports for the parametric device 100. For example, the first resonant mode 110 and third resonant mode 130 of the parametric device 100 can both be configured to operate at a first resonant frequency, while the second resonant mode 120 can be configured to operate at a second resonant frequency that is different than the first resonant frequency.

In some example embodiments, parametric device 100 includes a combination of passive and parametric couplings provided to couple the various resonant modes 110, 120, and 130 to one another. For example, a coupling between the first port 111 (e.g., an input port) and third port 131 (e.g., an output port) corresponds to a coupling between the first resonant mode 110 and third resonant mode 130, such as passive coupling 140. In some embodiments, the passive coupling 140 between first resonant mode 110 and third resonant mode 130 can be a capacitive coupling. In some embodiments, the passive coupling 140 between first resonant mode 110 and third resonant mode 130 can be an inductive coupling. By providing a device configuration that accommodates at least one passive coupling to replace what would otherwise be a parametric coupling, circuitry simplification and size reduction can be advantageously realized. In addition, an output signal provided at the third port 131 remains coherent with an input signal provided at the first port 111, without requiring coherence of the pump and signal generators employed at parametric couplings within the device.

Still further, parametric device 100 can include a first parametric coupling 150 between the first resonant mode 110 and the second resonant mode 120 and a second parametric coupling 160 between the second resonant mode 120 and the third resonant mode 130. In some embodiments, the first parametric coupling 150 and second parametric coupling 160 include respective Josephson junction devices (e.g., SQUID couplers) that are pumped parametrically at respective parametric pump frequencies. When parametric device 100 is configured to operate as a circulator/isolator, the first parametric coupling 150 and the second parametric coupling 160 are configured to respectively receive first pump tone signal 155 characterized by a first pump frequency and second pump tone signal 165 characterized by a second pump frequency. The first pump frequency of first pump tone signal 155 and the second pump frequency of second pump tone signal 165 can be the same frequency. As such, in some implementations, a single signal generator can be employed as a source for providing both the first pump tone signal 155 and the second pump tone signal 165.

The same frequency of the first pump tone signal 155 and the second pump tone signal 165 can be defined as a difference between the first resonant frequency (e.g., the frequency of the first resonant mode 110 and third resonant mode 130) and the second resonant frequency (e.g., the frequency of the second resonant mode 120). For instance, if first resonant mode 110 and third resonant mode 130 are respectively configured to operate at a first resonant frequency of about 4.0 GHZ, and the second resonant mode 120 is configured to operate at a second resonant frequency of about 6.17 GHZ, then a first pump frequency of the first pump tone signal 155 provided to the first parametric coupling 150 and a second pump frequency of the second pump tone signal 165 provided to the second parametric coupling 160 can be the difference between 6.17 GHZ and 4.0 GHZ, or about 2.17 GHZ. A phase of the first pump tone signal 155 provided to the first parametric coupling 150 can be shifted (e.g., shifted by a phase offset of about $\pm\pi/2$ or $\pm 90$ degrees) relative to a phase of the second pump tone signal 165 provided to the second parametric coupling 160.

Figure 2:
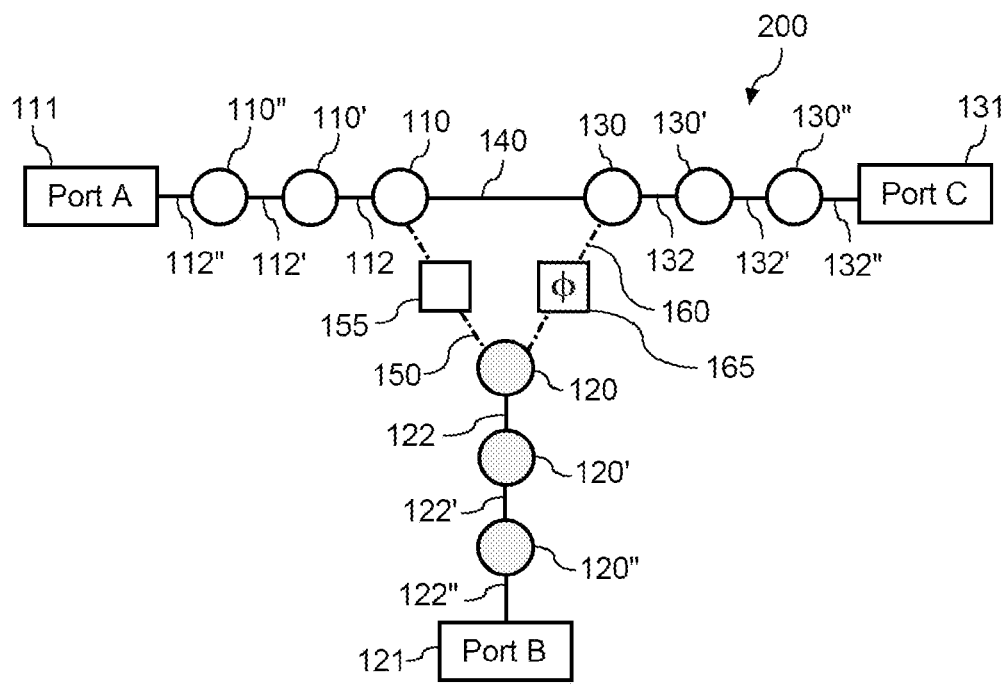
FIG. 2 depicts an example block diagram of a second exemplary parametric device according to example aspects of the present disclosure.

Referring now to FIG. 2, a second exemplary parametric device according to example aspects of the present disclosure (e.g., parametric device 200) is similar to the parametric device 100 of FIG. 1, with the incorporation of additional resonant modes and matching circuitry to get better broadband response in both transmission and isolation of device signals. As such, parametric device 200 is shown to include like reference numerals for first resonant mode 110, first port 111, second resonant mode 120, second port 121, third resonant mode 130, third port 131, passive coupling 140, first parametric coupling 150), first pump tone signal 155, second parametric coupling 160, and second pump tone signal 165. The description of FIG. 1 as applied to such elements applies to the embodiment illustrated in and described with reference to FIG. 2.

Parametric device 200 of FIG. 2 includes a plurality of additional resonant modes, for instance, one or more additional first resonant modes 110', 110" coupled between the first resonant mode 110 and the first port 111, one or more additional second resonant modes 120', 120" coupled to the second resonant mode 120, and one or more additional third resonant modes 130', 130" coupled between the third resonant mode 130 and the third port 131. More particularly, in some embodiments, parametric device 200 can include three first resonant modes 110, 110', and 110", three second resonant modes 120, 120', and 120", and three third resonant modes 130, 130', and 130", each iteration within a given resonant mode configured to operate at substantially the same resonant frequency. In some embodiments, each of the first resonant modes 110, 110', and 110" as well as each of the third resonant modes 130, 130', and 130" can be configured to operate at a first resonant frequency (e.g., 4.0 GHz), while each of the second resonant modes 120, 120', and 120" can be configured to operate at a second resonant frequency (e.g., 6.17 GHZ) that is different than the first resonant frequency. First resonant mode 110, second resonant mode 120, and third resonant mode 130 are configured to function as the core circulator device such as depicted in FIG. 1. The additional resonant modes 110', 110", 120', 120", 130', and 130" are designed to provide impedance matching to the respective 50-ohm ports corresponding to first port 111, second port 121, and third port 131 over a specified frequency band (e.g., Δω).

Still further, the matching circuitry of parametric device 200 can provide impedance matching over a specified frequency band to the first port 111 and the third port 131. In some example embodiments, the matching circuitry can also include additional passive couplings. More particularly, parametric device 200 can include additional passive couplings 112, 112', and 112" between the first resonant mode 110 and the one or more additional first resonant modes 110', 110" and between additional first resonant mode 110" and first port 111. Parametric device 200 can also include additional passive couplings 122, 122', and 122" between the second resonant mode 120 and the one or more additional second resonant modes 120', 120" and between the one or more additional second resonant modes 120" and second port 121. Still further, parametric device 200 can include additional passive couplings 132, 132', and 132" between the third resonant mode 130 and the one or more additional third resonant modes 130', 130" and between additional third resonant mode 130" and third port 131. Such additional passive couplings can include capacitive couplings and/or inductive couplings, without requiring additional parametric couplings.

Figure 3:
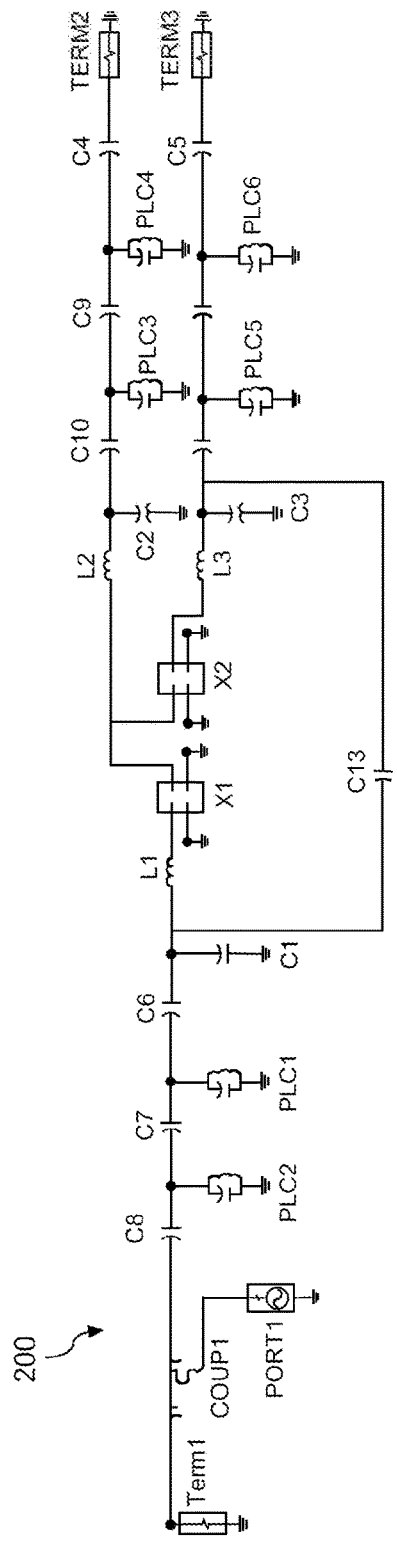
FIG. 3 depicts an example circuit schematic for implementing the second exemplary parametric device of FIG. 2 according to example aspects of the present disclosure.

FIG. 3 depicts an example circuit schematic for implementing the parametric device 200 of FIG. 2 according to example aspects of the present disclosure. Resonant modes (e.g., resonant modes 110, 110', 110", 120, 120' 120", 130, 130', and 130" of FIG. 2) are implemented as parallel LC circuits in the schematic of FIG. 3., and passive couplings (e.g., couplings 112, 112', 112", 122, 122', 122", 132, 132', 132", and 140) are implemented as capacitors. The first (A) port 111 of FIG. 2 is labeled Term1 in FIG. 3, and the third (C) port 131 is labeled Term3. Second (B) port 121 of FIG. 2 is labeled as Term2 in FIG. 3 and is assumed to be terminated with a 50-ohm load. With second (B) port (Term2) 121 terminated, parametric device 200 is a 2-port isolator.

Referring still to FIG. 3, the matching networks for the first, second and third resonant modes (e.g., first resonant modes 110, 110', 110", second resonant modes 120, 120", 120" and third resonant modes 130, 130', 130") are implemented based on a 3-pole Chebyshev prototype, with coefficients $g_0=1.0$, $g_1=0.6291$, $g_2=0.9702$, $g_3=0.6291$, $g_4=1.0$ for the matching circuits on each of the three ports (e.g., first port 111, second port 121, and third port 131). The coefficient $g_0$ here stands for the circulator core and $g_4$ represents the port.

First parametric coupling 150 and second parametric coupling 160 of FIG. 2 are represented in the schematic of FIG. 3 as circuit components X1 and X2, respectively. The first parametric coupling element, labeled X1 in FIG. 3, is modeled as an rf-SQUID providing a pump-modulated mutual coupling between the resonator composed of C1 and L1 (first resonant mode 110) and that composed of C2 and L2 (second resonant mode 120). The second parametric coupling element, labeled X2 in FIG. 3 is likewise providing a pump-modulated mutual coupling between the resonator composed of C3 and L3 (third resonant mode 130) and that composed of C2 and L2 (resonant mode 120). Capacitor C13 in FIG. 3 provides the passive same-frequency coupling between first resonant mode 110 and third resonant mode 130 of FIG. 2, and corresponds to passive coupling 140 in FIG. 2. The value of capacitor C13 can be determined via:

$$\omega_A C^{AC} = J_{AC} = \frac{w}{g_0 g_1 \sqrt{Z_{A1} Z_{C1}}},$$

where $g_0$, $g_1$ are the 0th and 1st coefficients of the band-pass prototype used to synthesize the impedance matching network, $Z_{A1}$ and $Z_{C1}$ are the impedances of the first resonant mode 110 and third resonant mode 130, and w is the fractional bandwidth of the network. $C^{AC}$ is the capacitance of capacitor C13, $\omega_A$ is the resonant frequency for the first resonant mode, and $J_{AC}$ is the value of the corresponding admittance inverter realized by capacitor C13.

Figure 4:
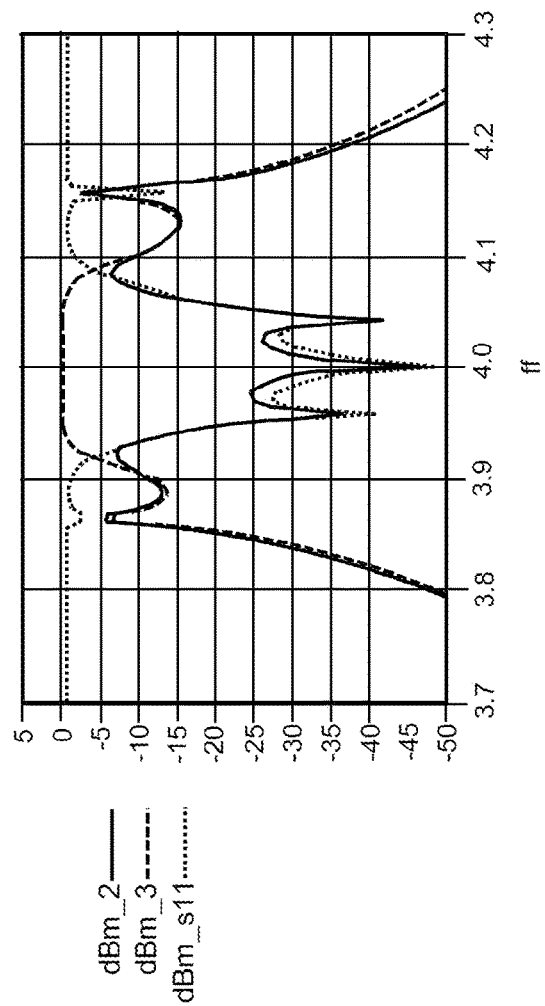
FIG. 4 depicts an example graph of harmonic balance simulation results for the example circuit schematic of FIG. 3 according to example aspects of the present disclosure.

Table 1 below shows component values (referencing elements as labeled in FIG. 2) for an example implementation of parametric device 200 as configured for use as a circulator/isolator circuit of the disclosed technology. FIG. 4 shows a harmonic-balance simulation in ADS of the schematic depicted in FIG. 3, using component values as shown in Table 1. The first and second parametric couplings 150, 160 are configured to have zero passive mutual coupling, and a modulated coupling amplitude of 17 ph. This can be realized using rf-SQUID coupling elements as depicted in FIGS. 10-11. Both couplers providing the first pump tone signal 155 and second pump tone signal 165 are modulated at the difference frequency of 2.17 GHz, and there is a 90-degree phase shift between the first pump tone signal 155 provided to X1 (i.e., first parametric coupling 150) and the second pump tone signal 165 provided to X2 (i.e., the second parametric coupling 160).

TABLE 1

Component Values for an Implementation of a Circulator/Isolator per FIG. 2.

| MODE | L (nH) | C (pF) | COUPLING | C (pF) |
|---|---|---|---|---|
| 110 & 130 | 0.150 | 7.947 | 112 & 132 | 0.104 |
| 110' & 130' | 1.194 | 1.180 | 112' & 132' | 0.042 |
| 110" & 130" | 1.194 | 1.086 | 112" & 132" | 0.212 |
| 120 | 0.15 | 3.765 | 122 | 0.038 |
| 120' | 0.774 | 0.804 | 122' | 0.018 |
| 120" | 0.774 | 0.737 | 122" | 0.109 |
|  |  |  | 140 | 0.315 |

In some specific implementations, band-pass network synthesis techniques can be employed to specifically engineer device bandwidth of the components in FIG. 2 or 3 in a manner that advantageously benefits overall device performance. For example, in quantum computing readout applications, matching circuitry is designed to achieve bandwidth of parametric device 200 that is greater than about 10 MHz. In some examples, matching circuitry is designed to achieve bandwidth of parametric device 200 that is greater than about 20 MHz. In some examples, matching circuitry is designed to achieve bandwidth of parametric device 200 that is up to about 500 MHz (½ GHz). In some examples, matching circuitry is designed to achieve bandwidth of parametric device 200 that is in a range of between about 20 MHz and about 500 MHz. This achieves significant benefits compared with known parametric device configurations that provide circuit gain and isolation in a relatively narrow band of about 10 MHz or less.

FIG. 4 depicts an example graph of harmonic balance simulation results for the example circuit schematic of FIG. 3 according to example aspects of the present disclosure. The red trace labeled dBm_s11 in FIG. 4 corresponds to the reflection (S11) of an input signal, in dB, from first (A) port 111. Over the bandwidth of the circuit (designed as 100 MHz around 4 GHZ) first (A) port 111 is matched with better than 20 dB return loss. The pink trace labeled dBm_3 corresponds to forward transmission from first (A) port 111 to third (C) port 131. Unity transmission over the pass band of the circuit can be observed in FIG. 4. The blue curve labeled dBm_2 corresponds to 'reverse transmission', or isolation, from first (A) port 111 to second (B) port 121. The parametric device 200 offers over 20 dB of isolation in this direction in the band of the circuit. While the signal at second (B) port 121 is converted to the 6.17 GHz band, the corresponding s-parameter is plotted in FIG. 4 (blue trace) as referenced to the frequency of the input signal.

Figure 5:
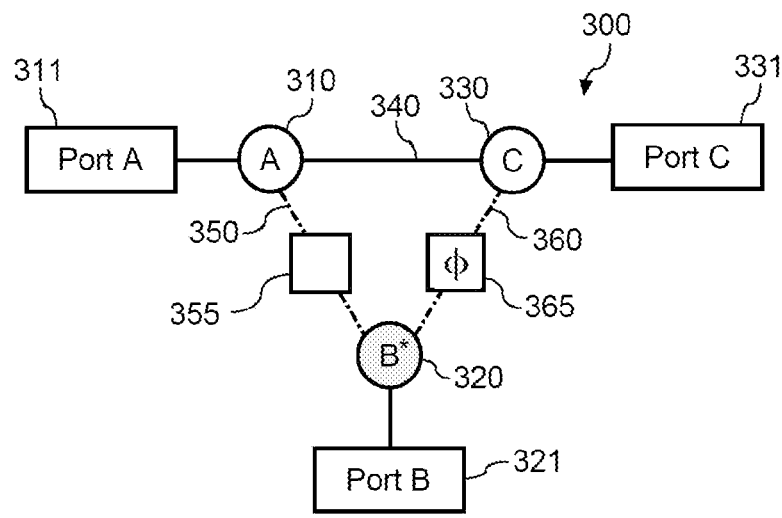
FIG. 5 depicts an example block diagram of a third exemplary parametric device according to example aspects of the present disclosure.

FIG. 5 depicts an example block diagram of a third exemplary parametric device according to example aspects of the present disclosure. More particularly, parametric device 300 corresponds to a Josephson parametric amplifier having same-frequency ports. Parametric device 300 can include a Josephson junction device configured to serve as a modulated reactance. Parametric device 300 can include a plurality of resonant modes, for example, a first (A) resonant mode 310, a second (B) resonant mode 320, and a third (C) resonant mode 330. The various resonant modes 310, 320, and 330 can be embodied by resonator structures (e.g., first, second, and third resonator structures), such as but not limited to lumped-element LC resonators, transmission line resonators, or any other resonant circuit (e.g., electrical, opto-mechanical, or the like).

Each resonant mode of parametric device 300 is coupled to a corresponding port. More particularly, first resonant mode 310 is coupled to a first (A) port 311, second resonant mode 320 is coupled to a second (B) port 321, and third resonant mode 330 is coupled to a third (C) port 331. First port 311 is configured to serve as an input port for parametric device 300, while third port 331 is configured to serve as an output port for parametric device 300. In some implementations, second port 321 provides an additional external port.

Referring still to FIG. 5, parametric device 300 can be configured to have same-frequency ports. This can be accomplished, at least in part, by configuring two of the three resonant modes 310, 320, and 330 to operate at a same first frequency. These same-frequency modes and corresponding ports can form the input and output modes/ports for the parametric device 300. For example, the first resonant mode 310 and third resonant mode 330 of the parametric device 300 can both be configured to operate at a first resonant frequency, while the second resonant mode 320 can be configured to operate at a second resonant frequency that is different than the first resonant frequency.

In some example embodiments, parametric device 300 includes a combination of passive and parametric couplings provided to couple the various resonant modes 310, 320, and 330 to one another. For example, a coupling between first port 311 serving as an input port and third port 331 serving as an output port corresponds to a coupling between the first resonant mode 310 and third resonant mode 330 and can be a passive coupling 340. In some embodiments, the passive coupling 340 between first resonant mode 310 and third resonant mode 330 can be a capacitive coupling. In some embodiments, the passive coupling 340 between first resonant mode 310 and third resonant mode 330 can be an inductive coupling. By providing a device configuration that accommodates at least one passive coupling to replace what would otherwise be a parametric coupling, circuitry simplification and size reduction can be advantageously realized. In addition, an output signal provided at the third port 331 remains coherent with an input signal provided at the first port 311, without requiring coherence of the pump and signal generators employed at parametric couplings within the device.

Still further, parametric device 300 can include a first parametric coupling 350 between the first resonant mode 310 and the second resonant mode 320 and a second parametric coupling 360 between the second resonant mode 320 and the third resonant mode 330. In some embodiments, the first parametric coupling 350) and second parametric coupling 360 include respective SQUID couplers that are pumped parametrically at respective parametric pump frequencies. Parametric device 300 can be configured to operate as a directional amplifier such that the first parametric coupling 350 and the second parametric coupling 360 are configured to respectively receive first pump tone signal 355 characterized by a first pump frequency and second pump tone signal 365 characterized by a second pump frequency. The first pump frequency of first pump tone signal 355 and the second pump frequency of second pump tone signal 365 can be the same frequency. As such, in some implementations, a single signal generator can be employed as a source for providing both the first pump tone signal 355 and the second pump tone signal 365.

The same frequency of the first pump tone signal 355 and the second pump tone signal 365 can be defined as a sum of the first resonant frequency (e.g., the frequency of the first resonant mode 310 and third resonant mode 330) and the second resonant frequency (e.g., the frequency of the second resonant mode 320). For instance, if first resonant mode 310 and third resonant mode 330 are respectively configured to operate at a first resonant frequency of about 4.0 GHZ, and the second resonant mode 320 is configured to operate at a second resonant frequency of about 8.17 GHZ, then a first pump frequency of the first pump tone signal 355 provided to the first parametric coupling 350 and a second pump frequency of the second pump tone signal 365 provided to the second parametric coupling 360 can be the sum of 8.17 GHz and 4.0 GHZ, or about 12.17 GHZ. A phase of the first pump tone signal 355 provided to the first parametric coupling 350) can be shifted (e.g., shifted by a phase offset of about $\pm\pi/2$ or $\pm 90$ degrees) relative to a phase of the second pump tone signal 365 provided to the second parametric coupling 360.

Figure 6:
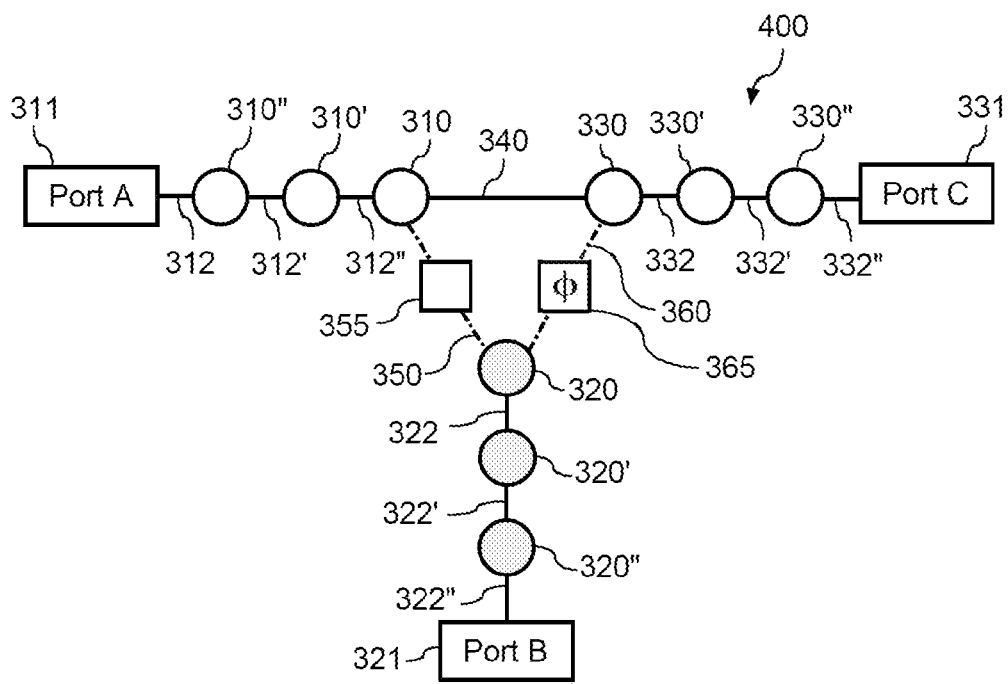
FIG. 6 depicts an example block diagram of a fourth exemplary parametric device according to example aspects of the present disclosure.

Referring now to FIG. 6, a fourth exemplary parametric device according to example aspects of the present disclosure (e.g., parametric device 400) is similar to the parametric device 300 of FIG. 5, with the incorporation of additional resonant modes and matching circuitry to get better broadband response in both transmission and isolation of device signals. As such, parametric device 400 is shown to include like reference numerals for first resonant mode 310, first port 311, second resonant mode 320, second port 321, third resonant mode 330, third port 331, passive coupling 340, first parametric coupling 350), first pump tone signal 355, second parametric coupling 360, and second pump tone signal 365. The description of FIG. 6 as applied to such elements applies to the embodiment illustrated in and described with reference to FIG. 5.

Parametric device 400 of FIG. 6 includes a plurality of additional resonant modes, for instance, one or more additional first resonant modes 310', 310" coupled between the first resonant mode 310 and the first port 311, one or more additional second resonant modes 320', 320" coupled to the second resonant mode 320, and one or more additional third resonant modes 330', 330" coupled between the third resonant mode 330 and the third port 331. More particularly, in some embodiments, parametric device 400 can include three first resonant modes 310, 310', and 310", three second resonant modes 320, 320', and 320", and three third resonant modes 330, 330', and 330", each iteration within a given resonant mode configured to operate at substantially the same resonant frequency. In some embodiments, each of the first resonant modes 310, 310', and 310" as well as each of the third resonant modes 330, 330', and 330" can be configured to operate at a first resonant frequency (e.g., 4.0 GHZ), while each of the second resonant modes 320, 320', and 320" can be configured to operate at a second resonant frequency (e.g., 8.17 GHZ) that is different than the first resonant frequency. Resonant modes 310, 320, and 330 are configured to function as the core directional amplifier device such as depicted in FIG. 5. The additional resonant modes 310", 310", 320', 320", 330', and 330" are designed to provide impedance matching to the respective 50-ohm ports corresponding to first port 311, second port 321, and third port 331 over a specified frequency band (e.g., Δω).

Still further, the matching circuitry of parametric device 400 can provide impedance matching over a specified frequency band to the first port 311 and the third port 331. In some example embodiments, the matching circuitry can also include additional passive couplings. More particularly, parametric device 400 can include additional passive couplings 312, 312', and 312" between the first resonant mode 310 and the one or more additional first resonant modes 310', 310" and between additional first resonant mode 310" and first port 311. Parametric device 400 can also include additional passive couplings 322, 322', and 322" between the second resonant mode 320 and the one or more additional second resonant modes 320', 320" and between the one or more additional second resonant modes 320" and second port 321. Still further, parametric device 400 can include additional passive couplings 332, 332', and 332" between the third resonant mode 330 and the one or more additional third resonant modes 330', 330" and between additional third resonant mode 330" and third port 331. Such additional passive couplings can include capacitive couplings and/or inductive couplings, without requiring additional parametric couplings.

Referring still to FIG. 6, the circuit topology of parametric device 400 configured for operation as a directional amplifier is similar in many respects to that of parametric device 200 of FIG. 2. However, the first parametric coupling 350 that connects first resonant mode 310 to second resonant mode 320 and the second parametric coupling 360 that connects second resonant mode 320 to third resonant mode 330 are driven with sum-frequency pumps, giving rise to parametric amplification processes. Second (B) port 321 is internally terminated (e.g., terminated with a 50-ohm port). Because second (B) port 321 is active in the sense that it is associated with reflection gain, its matching circuit is described by different coefficients which are passive (e.g., having no reflection gain). The coefficients used for the matching circuits of first (A) port 311 and third (C) port 331 are $g_0$=1.0, $g_1$=0.6291, $g_2$=0.9702, $g_3$=0.6291, $g_4$=1.0, similar to the parametric device 200 of FIGS. 2-3 configured to operate as a circulator. However, the matching circuit on second (B) port 321 are $g_0$=1.0, $g_1$=0.6068, $g_2$=0.6742, $g_3$=0.3836, $g_4$=0.8992. As in the previous example, the coefficient $g_0$ corresponds to the amplifier core and $g_4$ corresponds to the port.

Figure 7:
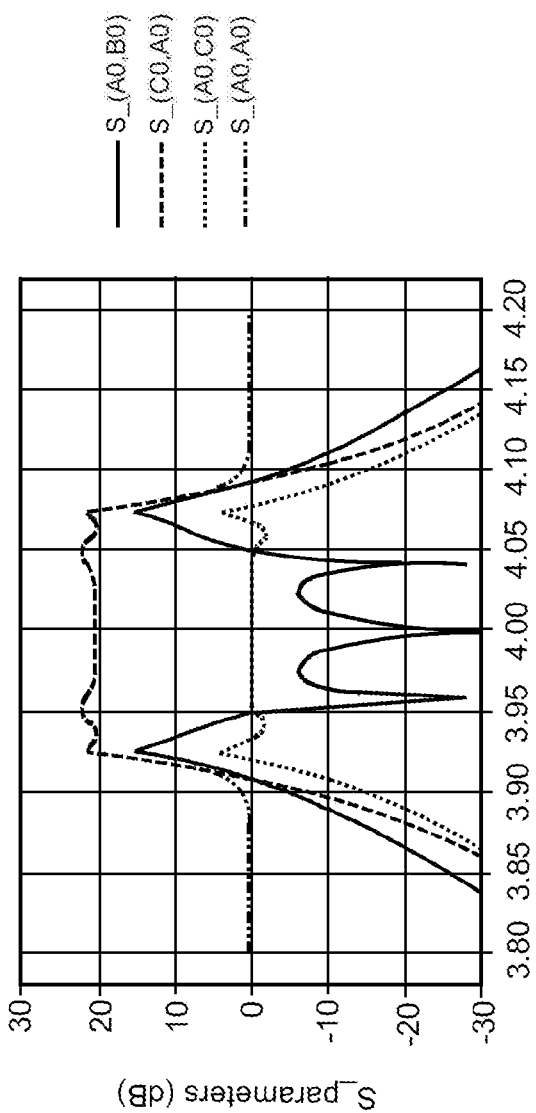
FIG. 7 depicts an example graph of S-parameter calculations for the example parametric device of FIG. 6 according to example aspects of the present disclosure.

FIG. 7 shows a calculation of the S-parameters of an example circuit based on FIG. 6. The orange curve labeled S_(C0,A0) is the forward gain, from first (A) port 311 to third (C) port 331, showing 20 dB gain over the 100 MHz design bandwidth. The green curve, labeled S_(A0,C0) represents the reverse gain from third (C) port 331 to first (A) port 311, which is unity (0) dB). Thus, the amplifier has gain in one direction but not in the reverse direction. The blue curve labeled S_(A0,A0) is the reflection off of the first (A) port 311 (partially overlapping with the maroon curve), showing that the input of the amplifier is matched, with better than 5 dB return loss. The maroon curve, labeled S_(A0,B0) represents the transmission towards the first (A) port 311 of any signals (or indeed noise) entering the amplifier from second (B) port 321, showing better than 5 dB isolation between these ports. This last property of the amplifier is important, since in the context of qubit readout it is important to not have amplified noise from the amplifier impinging on the readout resonators and qubits.

Figure 8:
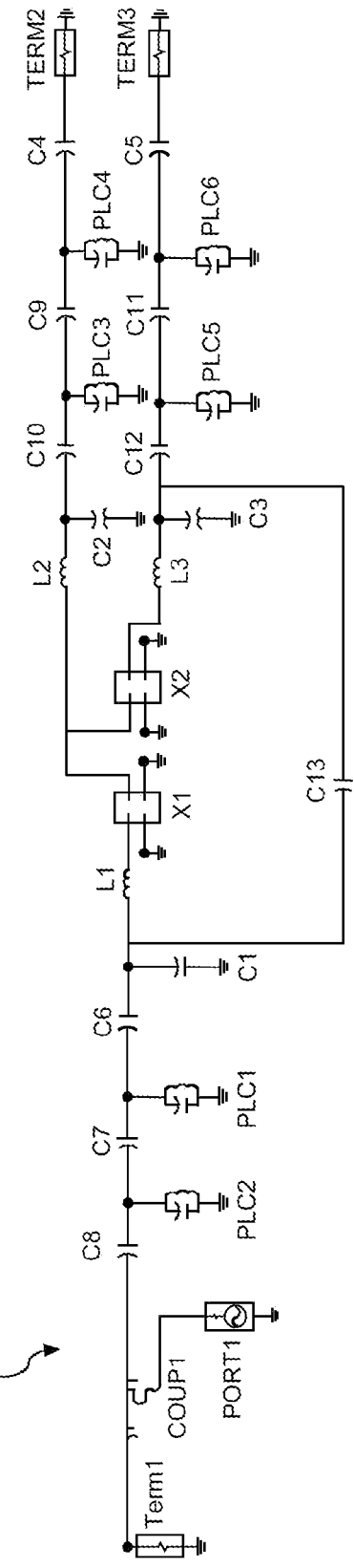
FIG. 8 depicts an example circuit schematic for implementing the fourth exemplary parametric device of FIG. 6 according to example aspects of the present disclosure.

FIG. 8 depicts an example circuit schematic for implementing the parametric device 400 of FIG. 6 according to example aspects of the present disclosure. The circuit schematic of FIG. 8 is used for simulation in ADS. The topology of the circuit depicted in FIG. 8 is similar to that of the circuit depicted in FIG. 3, however the component values are different, owing to different frequencies and the different prototype used for the second resonant modes in this example. The various resonant modes (e.g., resonant modes 310, 310', 310", 320, 320' 320", 330, 330', and 330" of FIG. 2) are implemented as parallel LC circuits in the schematic of FIG. 7, and passive couplings (e.g., couplings 312, 312, 312", 322, 322', 322", 332, 332', 332", and 340) are implemented as capacitors. The first (A) port 311 of FIG. 6 is labeled Term1 in FIG. 7, and the third (C) port 331 is labeled Term3. Second (B) port 321 of FIG. 6 is labeled as Term2 in FIG. 7 and is assumed to be terminated with a 50-ohm load. Second (B) port (Term2) 321 is internally terminated (e.g., terminated with a 50-ohm load). The first and third resonant modes (e.g., resonant modes 310, 310", 310", 330, 330', and 330") are configured to operate at a first resonant frequency of 4.0 GHZ while the second resonant modes (e.g., resonant modes 320, 320', and 320") are configured to operate at a second resonant frequency of 8.17 GHZ.

First parametric coupling 350 and second parametric coupling 360 of FIG. 6 are represented in the schematic of FIG. 8 as circuit components X1 and X2, respectively. Because parametric device 400 as depicted in FIG. 8 is configured to operate as a directional amplifier, the parametric couplings 350 and 360 are driven with sum-frequency pumps, giving rise to parametric amplification processes. More particularly, X1 and X2 are configured to receive pump frequencies corresponding to the sum of the first and second resonant frequencies, or 12.17 GHZ. The first parametric coupling element, labeled X1 in FIG. 8, is modeled as an rf-SQUID providing a pump-modulated mutual coupling between the resonator composed of C1 and L1 (first resonant mode 310) and that composed of C2 and L2 (second resonant mode 320). The second parametric coupling element, labeled X2 in FIG. 8 is likewise providing a pump-modulated mutual coupling between the resonator composed of C3 and L3 (third resonant mode 330) and that composed of C2 and L2 (second resonant mode 320). The amplitude of the pump tone signal provided at X1 corresponds to modulation of the mutual coupling between the corresponding modes by 23 pH, and X2 is driven similarly at 12.17 GHz to modulate the corresponding mutual coupling by 22 pH, with an 83-degree phase shift relative to the X1 drive. First resonant mode 310 and third resonant mode 330 have additional 0.15 nH each from the coupler, and second resonant mode 320 has 0.075 nH additional inductance.

Table 2 below shows component values (referencing elements as labeled in FIG. 6) for an example implementation of parametric device 400 as configured for use as a directional amplifier circuit of the disclosed technology.

TABLE 2

Component Values for an Implementation of a Directional Amplifier per FIG. 8.

| MODE | L (nH) | C (pF) | COUPLING | C (pF) |
| --- | --- | --- | --- | --- |
| 310 & 330 | 0.050 | 7.497 | 312 & 332 | 0.104 |
| 310' & 330' | 1.194 | 1.180 | 312' & 332' | 0.042 |
| 310" & 330" | 1.194 | 1.086 | 312" & 332" | 0.212 |
| 320 | 0.050 | 3.008 | 322 | 0.028 |
| 320' | 0.584 | 0.605 | 322' | 0.016 |
| 320" | 0.584 | 0.539 | 322" | 0.100 |
|  |  |  | 340 | 0.340 |

Figure 9:
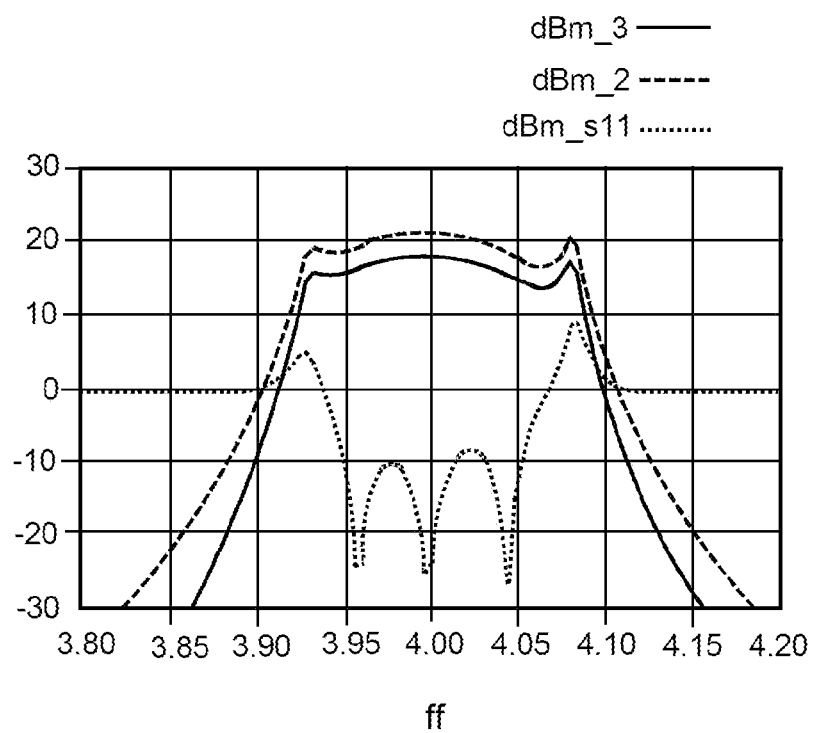
FIG. 9 depicts an example graph of harmonic balance simulation results for the example circuit schematic of FIG. 8 according to example aspects of the present disclosure.

FIG. 9 shows the results of a harmonic balance simulation in ADS of the schematic in FIG. 8 using the component values in Table 2. The various illustrated curves depict a transmission in dB from the input port A to the terminated port B (red) and the output port C (blue), and reflection at port A (pink). Roughly 17 dB of gain is realized in the forward direction (blue curve labeled dBm_3) and better than 10 dB return loss on the input port (pink curve labeled dBm_s11). There is also gain from the input port to the terminated port (red curve labeled dBm_2) as expected from theory. The higher gain seen here is consistent with Manley-Rowe gain $10 \log_{10}(8.17 \text{ GHz}/4 \text{ GHz}) \sim 3$ dB]. The simulated response in FIG. 9 is in reasonable agreement with the theoretically calculated response in FIG. 7. An important advantage of the devices described here, is that the input and output ports have the same frequency and are coherent with each other irrespective of the pump overall phase. Therefore, in a qubit readout context, the readout receiver can be configured to phase-lock to the readout transmitter, and we do not need to require strict phase relation between the pump generator and the readout transmitter.

Figure 10A:
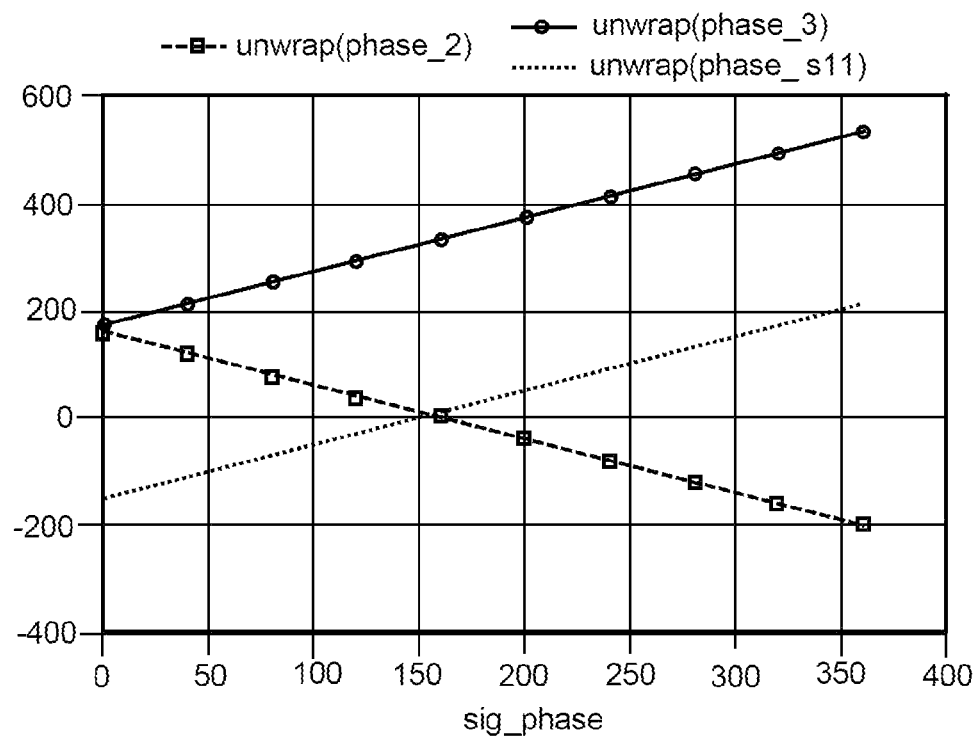
FIGS. 10A and 10B depict example simulation graphs for the example circuit schematic of FIG. 8 according to example aspects of the present disclosure.
Figure 10B:
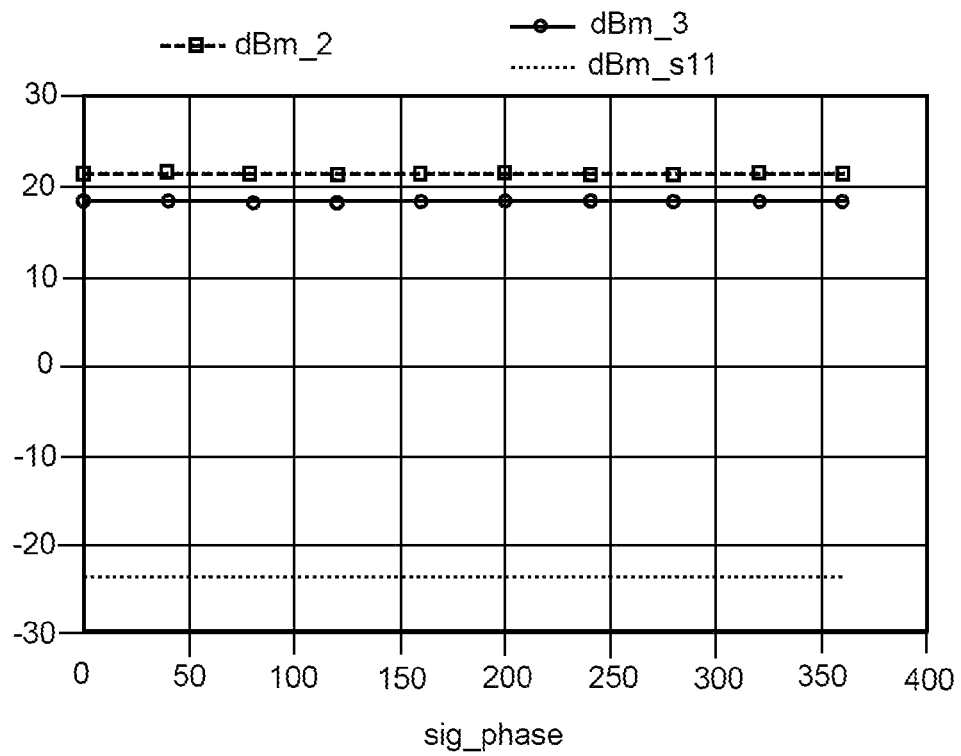
Figure 11:
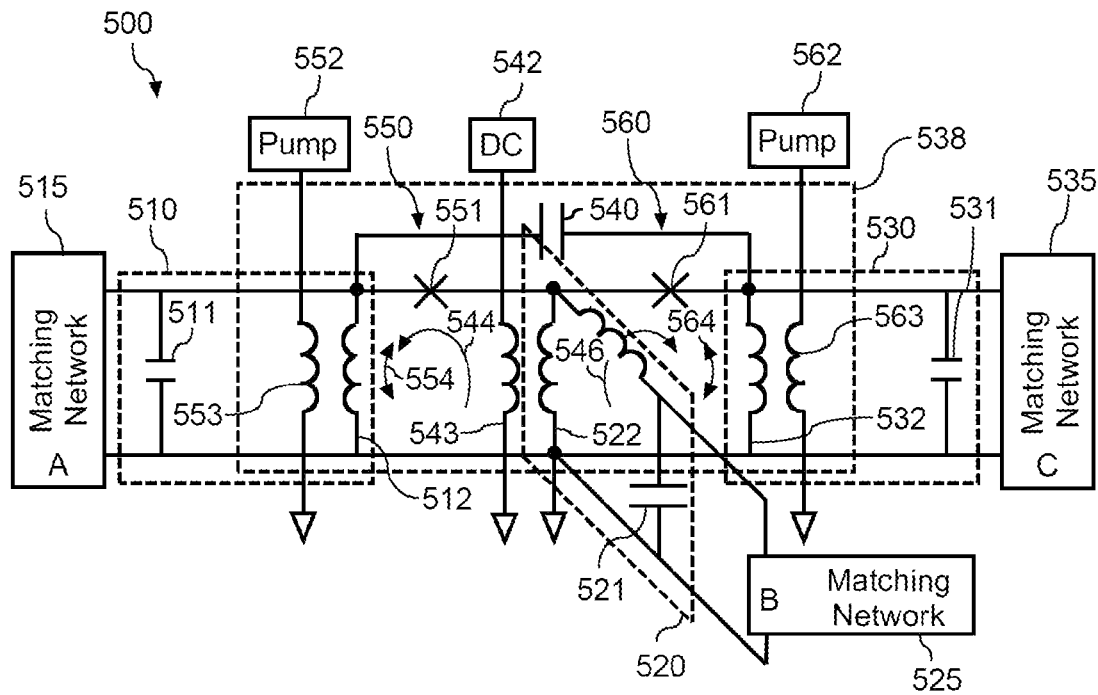
FIG. 11 depicts a block diagram of a first exemplary coupling circuit for a parametric device according to aspects of the present disclosure.

FIGS. 10A and 10B depict simulation parameters in phase (degrees) and magnitude (dB), respectively, for an input signal at 4.0 GHZ and as a function of signal phase relative to pump phase. More particularly, FIG. 10A demonstrates in simulation that the amplified output of the directional amplifier tracks the phase of the input signal (albeit with constant offset). FIG. 10B shows that the magnitude of the s-parameters does not depend on the signal phase relative to the pump.

FIG. 11 depicts a block diagram of a first exemplary coupling circuit for a parametric device according to aspects of the present disclosure. More particularly, a coupling circuit 500 as depicted in FIG. 11 can be used to implement one or more of the parametric devices 100, 200, 300, or 400 illustrated in the present disclosure. Coupling circuit 500 can include a first resonant mode 510, a first matching network 515, a second resonant mode 520, a second matching network 525, a third resonant mode 530, a third matching network 535, a passive coupling 540, a DC source 542, a first magnetic flux portion 544, a second magnetic flux portion 546, a first parametric coupling 550, a first Josephson junction 551, a first pump tone source 552, a third magnetic flux portion 554, a second parametric coupling 560, a second Josephson junction 561, a second pump tone source 562, and a fourth magnetic flux portion 564. First pump tone source 552 and second pump tone source 562 can be derived from a single signal generator (not illustrated).

Referring still to FIG. 11, various components of coupling circuit 500 can correspond to components illustrated in and described with reference to FIGS. 1-2 when coupling circuit 500 is employed to implement a circulator/isolator. Similarly, various components of coupling circuit 500 can correspond to components illustrated in and described with reference to FIGS. 5-6 when coupling circuit 500 is employed to implement a directional amplifier. Description of corresponding components from FIGS. 1-2, 5-6 and other related figures and description is considered to apply when appropriate to the corresponding components depicted in FIG. 11.

For instance, first resonant mode 510 of FIG. 11 can correspond, for example, to first resonant mode 110 of FIGS. 1-2 or to first resonant mode 310 of FIGS. 5-6. As illustrated, first resonant mode 510 of FIG. 11 can be an LC resonator that includes a first capacitor 511 and a first inductor 512. First matching network 515 of FIG. 11 can correspond to additional first resonant modes 110', 110" and passive couplings 112, 112', 112" of FIG. 2 or to additional first resonant modes 310', 310" and passive couplings 312, 312', 312" of FIG. 6. Second resonant mode 520 of FIG. 11 can correspond, for example, to second resonant mode 120 of FIGS. 1-2 or to second resonant mode 320 of FIGS. 5-6. As illustrated, second resonant mode 520 of FIG. 11 can be an LC resonator that includes a second capacitor 521 and a second inductor 522. Second matching network 525 of FIG. 11 can correspond to additional second resonant modes 120', 120" and passive couplings 122, 122', 122" of FIG. 2 or to additional second resonant modes 320', 320" and passive couplings 322, 322, 322" of FIG. 6. Third resonant mode 530 of FIG. 11 can correspond, for example, to third resonant mode 130 of FIGS. 1-2 or to third resonant mode 330 of FIGS. 5-6. As illustrated, third resonant mode 530 of FIG. 11 can be an LC resonator that includes a third capacitor 531 and a third inductor 532. Third matching network 535 of FIG. 11 can correspond to additional third resonant modes 130', 130" and passive couplings 132, 132', 132" of FIG. 2 or to additional third resonant modes 330', 330" and passive couplings 332, 332', 332" of FIG. 6. First resonant mode 510 and third resonant mode 530 are both configured to operate at a first resonant frequency and the second resonant mode 520 is configured to operate at a second resonant frequency that is different than the first resonant frequency.

Referring still to FIG. 11, coupling circuit 500 includes a passive coupling 540 coupled between first resonant mode 510 and third resonant mode 530, particularly corresponding to a capacitive coupling. A first parametric coupling couples the first resonant mode 510 to the second resonant mode 520, while a second parametric coupling couples the second resonant mode 520 to the third resonant mode 530. First parametric coupling 550 and second parametric coupling 560 can include respective Josephson junctions 551, 561, which are depicted as X-shaped circuit elements in coupling circuit 500. More particularly, first parametric coupling 550) positioned between first resonant mode 510 and second resonant mode 520) can correspond to an rf-SQUID composed of first Josephson junction 551, inductor 512, and inductor 522. Second parametric coupling 560 positioned between second resonant mode 520) and third resonant mode 530 can correspond to an rf-SQUID composed of second Josephson junction 561, inductor 522, and inductor 532.

First parametric coupling 550) is pumped with a first pump tone source 552, while second parametric coupling 560 is pumped with a second pump tone source 562. The first pump tone source 552 and second pump tone source 562 are configured to be the same frequency, although a phase of the first pump tone source 552 provided to the first parametric coupling 550 is shifted relative to a phase of the second pump tone source 562 provided to the second parametric coupling 560. In some exemplary embodiments, both the first pump tone source 552 and the second pump tone source 562 are provided by the same signal generator, thus minimizing hardware space compared with an implementation not having same frequency ports that would require pump sources at different frequencies. When coupling circuit 500 is employed to implement a circulator/isolator, first pump tone source 552 and second pump tone source 562 are generated at a same frequency that is defined as a difference between the first resonant frequency of first resonant mode 510 and third resonant mode 530) and the second resonant frequency of second resonant mode 520. When coupling circuit 500 is employed to implement a directional amplifier, first pump tone source 552 and second pump tone source 562 are generated at a same frequency that is defined as a sum of the first resonant frequency of first resonant mode 510 and third resonant mode 530 and the second resonant frequency of second resonant mode 520.

The configuration of circuit components in coupling circuit 500 as well as the provision of DC source 542, first pump tone source 552, and second pump tone source 562 induces current and corresponding magnetic flux within coupling circuit 500. For example, DC source 542 can be coupled to inductor 543 that pairs with second inductor 522 to form a bias transformer that induces current yielding a first magnetic flux portion 544 and second magnetic flux portion 546. The first magnetic flux portion 544 can help to ensure a substantially zero passive coupling through the rf-SQUID including first Josephson junction 551, so that only a parametric coupling is provided between first resonant mode 510 and second resonant mode 520. The second magnetic flux portion 546 can help ensure a substantially zero passive coupling through the rf-SQUID including second Josephson junction 561, so that only a parametric coupling is provided between second resonant mode 520 and third resonant mode 530. First pump tone source 552 can be coupled to a first pump inductor 553 that pairs with first inductor 512 to form a first pump transformer that induces current yielding a third magnetic flux portion 554. Second pump tone source 562 can be coupled to a second pump inductor 563 that pairs with third inductor 532 to form a second pump transformer that induces current yielding fourth magnetic flux portion 564. The first magnetic flux portion 544 and third magnetic flux portion 554 are applied to Josephson junction device 551 within first parametric coupling 550. The second magnetic flux portion 546 and fourth magnetic flux portion 564 are applied to Josephson junction device 561 within second parametric coupling 560.

Figure 12:
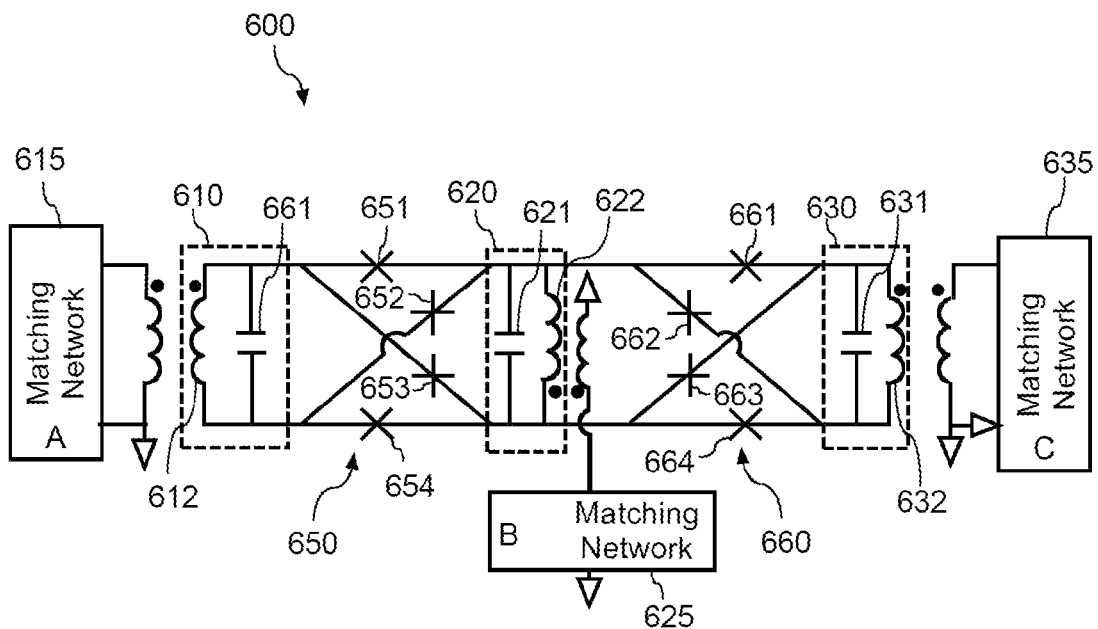
FIG. 12 depicts a block diagram of a second exemplary coupling circuit for a parametric device according to aspects of the present disclosure.

FIG. 12 depicts a block diagram of a second exemplary coupling circuit for a parametric device according to aspects of the present disclosure. More particularly, a coupling circuit 600 as depicted in FIG. 12 can be used to implement one or more of the parametric devices 100, 200, 300, or 400 illustrated in the present disclosure. Coupling circuit 600 can include a first resonant mode 610, a first matching network 615, a second resonant mode 620, a second matching network 625, a third resonant mode 630, a third matching network 635, a first parametric coupling 650 including a Josephson junction (JJ) array corresponding to a first plurality of JJ devices 651, 652, 653, 654, and a second parametric coupling 650 including a Josephson junction (JJ) array corresponding to a second plurality of JJ devices 661, 662, 663, 664.

Referring still to FIG. 12, various components of coupling circuit 600 can correspond to components illustrated in and described with reference to FIGS. 1-2 when coupling circuit 600 is employed to implement a circulator/isolator. Similarly, various components of coupling circuit 600 can correspond to components illustrated in and described with reference to FIGS. 5-6 when coupling circuit 600 is employed to implement a directional amplifier. Description of corresponding components from FIGS. 1-2, 5-6 and other related figures and description is considered to apply when appropriate to the corresponding components depicted in FIG. 12.

For instance, first resonant mode 610 of FIG. 12 can correspond, for example, to first resonant mode 110 of FIGS. 1-2 or to first resonant mode 310 of FIGS. 5-6. As illustrated, first resonant mode 610 of FIG. 12 can be an LC resonator that includes a first capacitor 611 and a first inductor 612. First matching network 615 of FIG. 12 can correspond to additional first resonant modes 110', 110" and passive couplings 112, 112', 112" of FIG. 2 or to additional first resonant modes 310', 310" and passive couplings 312, 312', 312" of FIG. 6. Second resonant mode 620 of FIG. 12 can correspond, for example, to second resonant mode 120 of FIGS. 1-2 or to second resonant mode 320 of FIGS. 5-6. As illustrated, second resonant mode 620 of FIG. 12 can be an LC resonator that includes a second capacitor 621 and a second inductor 622. Second matching network 625 of FIG. 12 can correspond to additional second resonant modes 120', 120" and passive couplings 122, 122', 122" of FIG. 2 or to additional second resonant modes 320', 320" and passive couplings 322, 322', 322" of FIG. 6. Third resonant mode 630 of FIG. 12 can correspond, for example, to third resonant mode 130 of FIGS. 1-2 or to third resonant mode 330 of FIGS. 5-6. As illustrated, third resonant mode 630) of FIG. 12 can be an LC resonator that includes a third capacitor 631 and a third inductor 632. Third matching network 635 of FIG. 12 can correspond to additional third resonant modes 130', 130" and passive couplings 132, 132', 132" of FIG. 2 or to additional third resonant modes 330', 330" and passive couplings 332, 332', 332" of FIG. 6. First resonant mode 610 and third resonant mode 630 are both configured to operate at a first resonant frequency and the second resonant mode 620 is configured to operate at a second resonant frequency that is different than the first resonant frequency.

Referring still to FIG. 12, coupling circuit 600 includes a balanced JJ coupler using a a first Josephson junction (JJ) array (e.g., the first plurality of JJ devices 651-654) as part of a first parametric coupling 650 between first resonant mode 610 and second resonant mode 620 and a second Josephson junction (JJ) array (e.g., the second plurality of JJ devices 661-664) as part of a second parametric coupling 660 between second resonant mode 620 and third resonant mode 630. The first plurality of JJ devices 651-654 forming the first JJ array and the second plurality of JJ devices 661-664 forming the second JJ array are depicted as X-shaped circuit elements in coupling circuit 600 and can correspond, for example, to any Josephson junction device such as an rf-SQUID device or other suitable device. By including JJ arrays 650, 660 instead of single JJ devices as in the coupling circuit 500 of FIG. 11, higher saturation power within coupling circuit 600 can be achieved. Although not illustrated in FIG. 12, coupling circuit 600 can also include additional circuit components, such as but not limited to a passive coupling (e.g., a capacitive coupling) between the first resonant mode 610 and third resonant mode 630, pump transformers and a bias transformer (such as implemented in FIG. 11 by the DC source 542, first pump tone source 552, second pump tone source 562 and corresponding inductors and associated circuit components).

Figure 13:
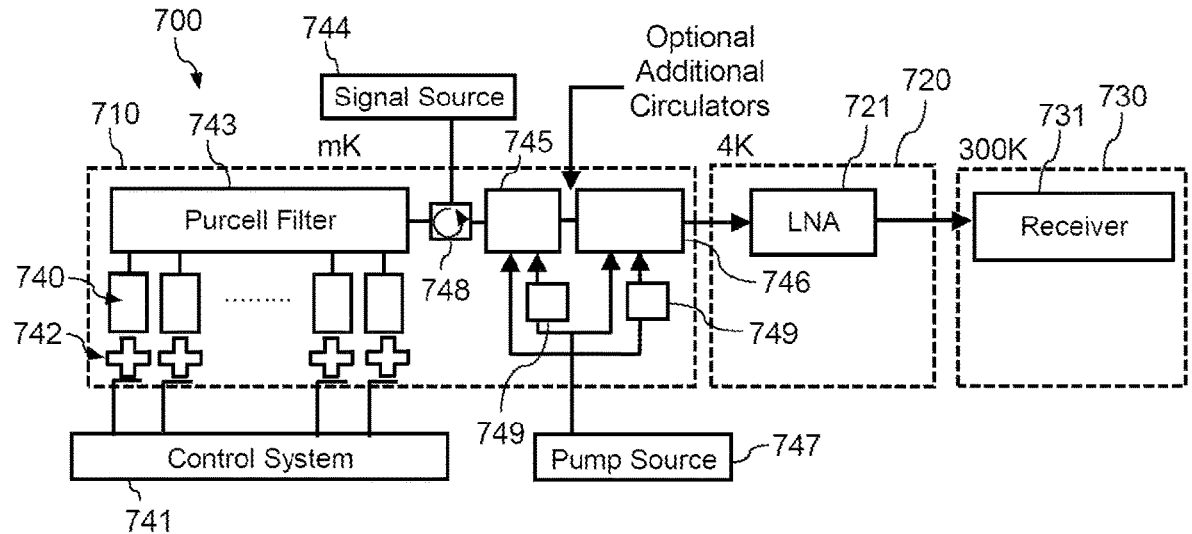
FIG. 13 depicts an example embodiment of a readout device according to example aspects of the present disclosure.

FIG. 13 depicts an example embodiment of a readout device according to example aspects of the present disclosure. For example, FIG. 13 depicts a readout system 700 that can include a first readout device 710, a second readout device 720, and a third readout device 730. The first readout device 710 can include one or more of the devices/circuits disclosed in accordance with the subject technology, such as but not limited to parametric devices 100, 200, 300, 400 or coupling circuits 500, 600. The first readout device 710 can include a plurality of readout resonators 740 and a control system 741 for coupling to a plurality of qubits 742, a filter 743, a signal source 744, a circulator/isolator 745, a directional amplifier 746, a pump source 747, an optional ferrite circulator 748, and phase shifters 749. The second readout device 720 can include a low-noise amplifier (LNA) 721, and third readout device 730 can include a receiver 731.

Referring more particularly to FIG. 13, the plurality of readout resonators 740) and control system 741 can be configured for coupling to a plurality of qubits 742. Qubits 742 can be formed in accordance with one or more of the same or different qubit technologies for quantum computing. For example, qubits 742 can be or can include superconducting qubits (e.g., transmon qubits), semiconductor quantum dots, trapped ion qubits, photonic qubits, defect-based qubits, topological nanowire qubits, or nuclear magnetic resonance qubits. Filter 743 (e.g., a Purcell filter or other bandpass filter) can be coupled to the plurality of readout resonators 740 and configured to produce a bandpass response for readout signals received by the plurality of readout resonators 740.

The readout system 700 of FIG. 13 can include at least a first Josephson parametric device configured to receive an output from the filter 743 as an input signal and to generate an output signal. As illustrated, first readout device 710 includes two Josephson parametric devices, namely a first Josephson parametric device corresponding to circulator/isolator 745 and a second Josephson parametric device corresponding to directional amplifier 746. Additional circulator/isolator components may sometimes be included between circulator/isolator 745 and directional amplifier 746. When additional circulator/isolator components are included, such components can sometimes correspond to parametric circulator/isolators as described herein (e.g., parametric devices 100, 200 depicted in FIGS. 1-3) or can alternatively correspond to conventional Ferrite circulators (e.g., optional Ferrite circulator 748). In still further embodiments, a readout system 700 can include conventional Ferrite circulators coupled to a parametric directional amplifier as described herein (e.g., parametric devices 300, 400 depicted in FIGS. 5-6 and 8).

Referring still to FIG. 13, circulator/isolator 745 can be implemented, for example, as parametric device 100 or 200 depicted in FIGS. 1-3. As such, circulator/isolator 745 can include first, second, and third resonant modes, the first resonant mode and the third resonant mode both configured to operate at a first resonant frequency and the second resonant mode configured to operate at a second resonant frequency that is different than the first resonant frequency. Circulator/isolator 745 can also include a plurality of couplings including a passive coupling between the first resonant mode and the third resonant mode, a first parametric coupling between the first resonant mode and the second resonant mode, and a second parametric coupling between the second resonant mode and the third resonant mode. The first parametric coupling between the first resonant mode and the second resonant mode and the second parametric coupling between the second resonant mode and the third resonant mode in circulator/isolator 745 can be configured to receive a pump tone signal characterized by a pump frequency that is defined as a difference between the first resonant frequency and the second resonant frequency. Pump tone signals for the first and second parametric couplings in circulator/isolator 745 can be provided from pump source 747, with one of phase shifters 749 implementing phase offset between the respective pump tone signals provided to the first and second parametric couplings.

Directional amplifier 746 forming a second Josephson parametric device can be configured to receive an output from circulator/isolator 745 forming a first Josephson parametric device as an input signal. Directional amplifier 746 can be further configured to generate an amplified output signal based on the readout from qubits 742. Directional amplifier 746 can be implemented, for example, as parametric device 300 or 400 depicted in FIGS. 5-6 and 8. As such, directional amplifier 746 can include fourth, fifth, and sixth resonant modes, the fourth resonant mode and the sixth resonant modes both configured to operate at a third resonant frequency and the fifth resonant mode configured to operate at a fourth resonant frequency that is different than the third resonant frequency. Directional amplifier 746 can also include a plurality of couplings including a passive coupling between the fourth resonant mode and the sixth resonant mode, a first parametric coupling between the fourth resonant mode and the fifth resonant mode, and a second parametric coupling between the fifth resonant mode and the sixth resonant mode. The first parametric coupling between the fourth resonant mode and the fifth resonant mode and the second parametric coupling between the fifth resonant mode and the sixth resonant mode in directional amplifier 746 can be configured to receive a pump tone signal characterized by a pump frequency that is defined as a sum of the third resonant frequency and the fourth resonant frequency. Pump tone signals for the first and second parametric couplings in directional amplifier 746 can be provided from pump source 747, with one of phase shifters 749 implementing phase offset between the respective pump tone signals provided to the first and second parametric couplings.

Readout system 700 of FIG. 13 can incorporate can also include additional readout devices provided in one or more temperature stages of the readout process. For example, Josephson parametric devices (e.g., circulator/isolator 745 implemented as a first Josephson parametric device and directional amplifier 746 implemented as a second Josephson parametric device) can be included in first readout device 710 provided for readout at lower temperature stages, while additional readout devices (e.g., second readout device 720 and third readout device 730) can be provided for readout or subsequent signal processing at higher temperature stages. In some examples, a second readout device 720 can include a low-noise amplifier (LNA) 721 and/or other receiver components (e.g., receiver 731) and can be provided at one or more higher temperatures. For example, a readout system 700 can include a first readout device 710 including one or more Josephson parametric devices (e.g., circulator/isolator 745 implemented as a first Josephson parametric device and directional amplifier 746 implemented as a second Josephson parametric device) that are configured for operation in a first temperature range (e.g., a cryogenic temperature range inclusive of less than about 1 kelvin (K) or less than about 100 millikelvin (mK)). Readout system 700 can further include at least one second readout device 720 (e.g., LNA 721) that is coupled to and configured to receive an output from the first readout device 710, and that is configured for operation in a second temperature range. In some examples, the second temperature range can be higher than the first temperature range, for example but not limited to a range inclusive of about 4 K, or between about 1 K and about 10 K. Readout system 700 can further include at least one third readout device 730 (e.g., a receiver 731) that is coupled to and configured to receive an output from the second readout device 720, and that is configured for operation in a third temperature range. In some examples, the third temperature range can be higher than the second temperature range, for example but not limited to a range that is at or near room temperature (e.g., a range inclusive of about 300K, or between about 250 K and about 350 K).

Figure 14:
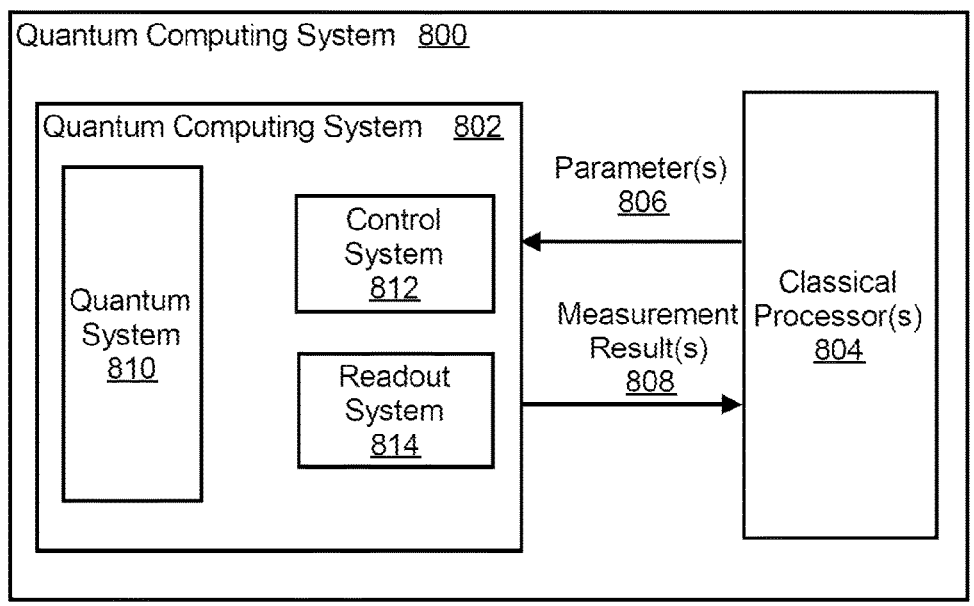
FIG. 14 depicts an example embodiment of a quantum computing system according to example aspects of the present disclosure.

FIG. 14 depicts an example quantum computing system 800. The quantum computing system 800 is an example of a system on one or more classical computers or quantum computing devices in one or more locations, in which the systems, components, and techniques described below can be implemented. Those of ordinary skill in the art, using the disclosures provided herein, will understand that other quantum computing structures or systems can be used without deviating from the scope of the present disclosure.

The quantum computing system 800 can include quantum hardware 802 in data communication with one or more classical processors 804. One or more parameters 806 can be communicated from the one or more classical processors 804 to the quantum hardware 802, while one or more measurement results 808 can be communicated from the quantum hardware 802 to the one or more classical processors 804. The quantum hardware 802 can include components for performing quantum computation. For example, the quantum hardware 802 includes a quantum system 810, control system 812, and readout system 814. In some implementations, control system 812 of FIG. 14 can correspond to control system 741 of FIG. 13. In some implementations, readout system 814 of FIG. 14 can correspond to or can include aspects of readout system 700 of FIG. 13.

Referring more particularly to FIG. 14, the quantum system 810 can include one or more multi-level quantum subsystems, such as a register of qubits. In some implementations, the multi-level quantum subsystems can include superconducting qubits, such as flux qubits, charge qubits, transmon qubits, gmon qubits, etc. The type of multi-level quantum subsystems that the quantum computing system 800 utilizes may vary. For example, in some cases it may be convenient to include one or more readout device(s) within readout system 814 attached to one or more superconducting qubits, e.g., transmon, flux, gmon, xmon, or other qubits. In other cases, ion traps, photonic devices or superconducting cavities may be used. Further examples of realizations of multi-level quantum subsystems include fluxmon qubits, silicon quantum dots or phosphorus impurity qubits.

Quantum circuits may be constructed and applied to the register of qubits included in the quantum system 810 via multiple control lines that are coupled to control system 812. Control system 812 can include control devices that operate on the register of qubits and can be used to implement quantum gates or quantum circuits having a plurality of quantum gates, e.g., Pauli gates, Hadamard gates, controlled-NOT (CNOT) gates, controlled-phase gates, T gates, multi-qubit quantum gates, coupler quantum gates, etc. Control system 812 may be configured to operate on the quantum system 810 through one or more respective control parameters (e.g., one or more physical control parameters). For example, in some implementations, the multi-level quantum subsystems may be superconducting qubits and control devices in control system 812 may be configured to provide control pulses to control lines to generate magnetic fields to adjust the frequency of the qubits.

The quantum hardware 802 of FIG. 14 may further include a readout system 814, such as one that includes one or more readout devices. For example, in some implementations, readout system 814 can include a first readout device 710, second readout device 720, and third readout device 730 such as depicted in readout system 700 of FIG. 13. As such, readout system 814 can include one or more Josephson parametric devices. Each Josephson parametric device in readout system 814 can include at least first, second, and third resonant modes, the first resonant mode and the third resonant mode both configured to operate at a first resonant frequency and the second resonant mode configured to operate at a second resonant frequency that is different than the first resonant frequency. Each Josephson parametric device in readout system 814 can also include a plurality of couplings including a passive coupling between the first resonant mode and the third resonant mode, a first parametric coupling between the first resonant mode and the second resonant mode, and a second parametric coupling between the second resonant mode and the third resonant mode. In some examples, the one or more Josephson parametric devices within readout system 814 includes a first Josephson parametric device configured to operate as a circulator or an isolator (e.g., circulator/isolator 745 of FIG. 13) and a second Josephson parametric device configured to operate as a directional amplifier (e.g., directional amplifier 746 of FIG. 13).

Referring still to FIG. 14, measurement results 808 obtained via measurement devices within quantum hardware 802 may be provided to the classical processors 804 for processing and analyzing. In some implementations, the quantum hardware 802 may include a quantum circuit and the control system 812 and readout system 814 may implement one or more quantum logic gates that operate on the quantum system 810 through physical control parameters (e.g., microwave pulses) that are sent through wires included in the quantum hardware 802. Further examples of control devices include arbitrary waveform generators, wherein a DAC (digital to analog converter) creates the signal.

The readout system 814 may be configured to perform quantum measurements on the quantum system 810 and send measurement results 808 to the classical processors 804. In addition, the quantum hardware 802 may be configured to receive data specifying physical control qubit parameter values (e.g., parameters 806) from the classical processors 804. The quantum hardware 802 may use the received physical control qubit parameter values (e.g., parameters 806) to update the action of the control system 812 and readout system 814 on the quantum system 810. For example, the quantum hardware 802 may receive data specifying new values representing voltage strengths of one or more DACs included in control system 812 and may update the action of the DACs on the quantum system 810 accordingly. The classical processors 804 may be configured to initialize the quantum system 810 in an initial quantum state, e.g., by sending data to the quantum hardware 802 specifying an initial set of parameters 806.

The readout system 814 can take advantage of a difference in the impedance for the |0> and |1> states of an element of the quantum system, such as a qubit, to measure the state of the element (e.g., the qubit). For example, the resonance frequency of a readout resonator in readout system 814 can take on different values when a qubit is in the state |0> or the state |1>, due to the nonlinearity of the qubit. Therefore, a microwave pulse reflected from a readout device in readout system 814 carries an amplitude and/or phase shift that depend on the qubit state. In some implementations, a Purcell filter (e.g., filter 743 of FIG. 13) can be used in conjunction with the readout device(s) in readout system 814 to impede microwave propagation at the qubit frequency.

Implementations of the digital, classical, and/or quantum subject matter and the digital functional operations and quantum operations described in this specification can be also implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs (e.g., one or more modules of digital and/or quantum computer program instructions encoded on a tangible non-transitory storage medium for execution by, or to control the operation of, data processing apparatus). The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit (i.e., a system that defines the unit of quantum information). It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions, or superconducting qubits. In many implementations the computational basis states are identified with the ground and first excited states, however it is understood that other setups where the computational states are identified with higher level excited states (e.g., qudits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital or classical computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc..

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices: magnetic disks, e.g., internal hard disks or removable disks: magneto-optical disks: and CD-ROM and DVD-ROM disks: and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more tangible, non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

What is claimed is:

1. A parametric device, comprising:
   first, second, and third resonator structures, the first resonator structure and the third resonator structure both configured to operate at a first resonant frequency and the second resonator structure configured to operate at a second resonant frequency that is different than the first resonant frequency;
   a passive coupling between the first resonator structure and the third resonator structure;
   an input port coupled to the first resonator structure of the parametric device; and
   an output port coupled to the third resonator structure of the parametric device.

2. The parametric device of claim 1, comprising:
   a first parametric coupling between the first resonator structure and the second resonator structure, the first parametric coupling comprising at least one Josephson junction configured to serve as a modulated reactance and configured to receive a first pump tone signal characterized by a first pump frequency; and
   a second parametric coupling between the second resonator structure and the third resonator structure, the second parametric coupling comprising at least one Josephson junction configured to serve as a modulated reactance and configured to receive a second pump tone signal characterized by a second pump frequency.

3. The parametric device of claim 2, comprising a single signal generator configured to provide both the first pump tone signal and the second pump tone signal.

4. The parametric device of claim 2, wherein:
the parametric device is configured to operate as a circulator;
the first pump frequency and the second pump frequency are the same frequency and one that is defined as a difference between the first resonant frequency and the second resonant frequency; and
a phase of the first pump tone signal provided to the first parametric coupling is shifted relative to a phase of the second pump tone signal provided to the second parametric coupling.

5. The parametric device of claim 2, wherein:
the parametric device is configured to operate as a directional amplifier;
the first pump frequency and the second pump frequency are the same frequency and one that is defined as a sum of the first resonant frequency and the second resonant frequency; and
a phase of the first pump tone signal provided to the first parametric coupling is shifted relative to a phase of the second pump tone signal provided to the second parametric coupling.

6. The parametric device of claim 2, wherein:
the parametric device comprises an impedance coupled to and providing an internal termination for the second resonator structure; and
the parametric device is configured to operate as an isolator.

7. The parametric device of claim 2, comprising:
matching circuitry comprising one or more additional first resonator structures coupled between the first resonator structure and the input port, one or more additional second resonator structures coupled to the second resonator structure, and one or more additional third resonator structures coupled between the third resonator structure and the output port, the matching circuitry providing impedance matching over a specified frequency band to the input port and the output port.

8. The parametric device of claim 7, comprising additional passive couplings between the first resonator structure and the one or more additional first resonator structures, between the one or more additional first resonator structures and the input port, between the second resonator structure and the one or more additional second resonator structures, between the one or more additional second resonator structures and an internal termination, between the third resonator structure and the one or more additional third resonator structures, and between the one or more additional third resonator structures and the output port.

9. The parametric device of claim 8, wherein one or more of the passive coupling between the first resonator structure and the second resonator structure and the additional passive couplings comprise capacitive couplings.

10. The parametric device of claim 8, wherein one or more of the passive coupling between the first resonator structure resonant mode and the second resonator structure resonant mode and the additional passive couplings comprise inductive couplings.

11. The parametric device of claim 2, wherein the first, second, and third resonator structures comprise lumped-element LC resonators.

12. A readout system for a quantum computing device, comprising:

a plurality of resonators configured for coupling to a respective plurality of qubits;
a filter coupled to the plurality of resonators and configured to produce a bandpass response for readout signals received by the plurality of resonators;
a first Josephson parametric device configured to receive an output from the filter as an input signal and to generate a first output signal, the first Josephson parametric device comprising:
first, second, and third resonant modes, the first resonant mode and the third resonant mode both configured to operate at a first resonant frequency and the second resonant mode configured to operate at a second resonant frequency that is different than the first resonant frequency; and
a plurality of couplings including a passive coupling between the first resonant mode and the third resonant mode, a first parametric coupling between the first resonant mode and the second resonant mode, and a second parametric coupling between the second resonant mode and the third resonant mode.

13. The readout system of claim 12, comprising:
a second Josephson parametric device configured to receive the first output signal from the first Josephson parametric device and to generate a second output signal, the second Josephson parametric device comprising:
fourth, fifth, and sixth resonant modes, the fourth resonant mode and the sixth resonant modes both configured to operate at a third resonant frequency and the fifth resonant mode configured to operate at a fourth resonant frequency that is different than the third resonant frequency; and
a plurality of couplings including a passive coupling between the fourth resonant mode and the sixth resonant mode, a first parametric coupling between the fourth resonant mode and the fifth resonant mode, and a second parametric coupling between the fifth resonant mode and the sixth resonant mode.

14. The readout system of claim 13, wherein:
the first Josephson parametric device is configured to operate as a circulator;
the first parametric coupling between the first resonant mode and the second resonant mode and the second parametric coupling between the second resonant mode and the third resonant mode are configured to receive a first pump tone signal characterized by a first pump frequency that is defined as a difference between the first resonant frequency and the second resonant frequency;
the second Josephson parametric device is configured to operate as a directional amplifier; and
the first parametric coupling between the fourth resonant mode and the fifth resonant mode and the second parametric coupling between the fifth resonant mode and the sixth resonant mode are configured to receive a second pump tone signal characterized by a second pump frequency that is defined as a sum of the third resonant frequency and the fourth resonant frequency.

15. The readout system of claim 14, wherein:
a phase of the first pump tone signal provided to the first parametric coupling between the first resonant mode and the second resonant mode is shifted relative to a phase of the first pump tone signal provided to the second parametric coupling between the second resonant mode and the third resonant mode; and a phase of the second pump tone signal provided to the first parametric coupling between the third resonant mode and the fourth resonant mode is shifted relative to a phase of the second pump tone signal provided to the second parametric coupling between the fifth resonant mode and the sixth resonant mode.

16. The readout system of claim 14, comprising:
a first signal generator for generating the first pump tone signal provided to the first parametric coupling and to the second parametric coupling; and
a second signal generator for generating the second pump tone signal provided to the third parametric coupling and to the fourth parametric coupling.

17. The readout system of claim 12, the first Josephson parametric device comprising:
matching circuitry comprising one or more additional first resonant modes coupled between the first resonant mode and an input port, one or more additional second resonant modes coupled between the second resonant mode and an internal termination, and one or more additional third resonant modes coupled between the third resonant mode and an output port, the matching circuitry providing impedance matching over a specified frequency band to the input port and the output port.

18. A quantum computing system, comprising:
quantum hardware comprising a plurality of qubits;
a readout system coupled to the plurality of qubits for receiving a readout response of the plurality of qubits, the readout system comprising one or more Josephson parametric devices, each Josephson parametric device comprising:
first, second, and third resonant modes, the first resonant mode and the third resonant mode both configured to operate at a first resonant frequency and the second resonant mode configured to operate at a second resonant frequency that is different than the first resonant frequency; and
a plurality of couplings including a passive coupling between the first resonant mode and the third resonant mode, a first parametric coupling between the first resonant mode and the second resonant mode, and a second parametric coupling between the second resonant mode and the third resonant mode.

19. The quantum computing system of claim 18, comprising:
a signal generator configured to generate a pump tone signal provided to both the first parametric coupling and the second parametric coupling;
wherein a phase of the pump tone signal provided to the first parametric coupling is shifted in phase relative to the pump tone signal provided to the second parametric coupling.

20. The quantum computing system of claim 18, wherein the one or more Josephson parametric devices comprise a first Josephson parametric device configured to operate as a circulator or an isolator and a second Josephson parametric device configured to operate as a directional amplifier.

* * * * *